United States Patent
Fu et al.

(10) Patent No.: US 9,466,578 B2
(45) Date of Patent: Oct. 11, 2016

(54) SUBSTRATE COMPRISING IMPROVED VIA PAD PLACEMENT IN BUMP AREA

(71) Applicant: QUALCOMM Incorporated, San Diego, CA (US)

(72) Inventors: Jie Fu, San Diego, CA (US); Manuel Aldrete, San Diego, CA (US); Milind Pravin Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/251,518

(22) Filed: Apr. 11, 2014

(65) Prior Publication Data
US 2015/0179590 A1 Jun. 25, 2015

Related U.S. Application Data

(60) Provisional application No. 61/919,157, filed on Dec. 20, 2013.

(51) Int. Cl.
 *H01L 23/00* (2006.01)
 *H01L 23/498* (2006.01)
 *H01L 21/48* (2006.01)

(52) U.S. Cl.
 CPC .............. *H01L 24/03* (2013.01); *H01L 21/486* (2013.01); *H01L 23/49827* (2013.01); *H01L 23/49838* (2013.01); *H01L 24/06* (2013.01); *H01L 24/11* (2013.01); *H01L 24/14* (2013.01); H01L 2224/0401 (2013.01); H01L 2224/0903 (2013.01); H01L 2224/0912 (2013.01); H01L 2924/12042 (2013.01); H01L 2924/381 (2013.01)

(58) Field of Classification Search
 CPC .......... H01L 2224/48229; H01L 2224/48227; H01L 24/12–24/14; H01L 25/0657
 See application file for complete search history.

(56) References Cited

U.S. PATENT DOCUMENTS 6,946,727 B2 9/2005 Ho et al.
7,728,439 B2 6/2010 Nishiyama et al.
(Continued)

FOREIGN PATENT DOCUMENTS

EP 0851724 A2 7/1998
EP 0883182 A2 12/1998
(Continued)

OTHER PUBLICATIONS

International Search Report and Written Opinion—PCT/US2014/070940—ISA/EPO—Mar. 19, 2015.

*Primary Examiner* — Victor A Mandala
*Assistant Examiner* — Regan J Rundio
(74) *Attorney, Agent, or Firm* — Loza & Loza, LLP

(57) ABSTRACT

Some novel features pertain to an integrated device that includes a substrate, a first via, and a first bump pad. The first via traverses the substrate. The first via has a first via dimension. The first bump pad is on a surface of the substrate. The first bump pad is coupled to the first via. The first bump pad has a first pad dimension that is equal or less then the first via dimension. In some implementations, the integrated device includes a second via and a second bump pad. The second via traverses the substrate. The second via has a second via dimension. The second bump pad is on the surface of the substrate. The second bump pad is coupled to the second via. The second bump pad has a second pad dimension that is equal or less then the second via dimension.

28 Claims, 19 Drawing Sheets

(56) References Cited

U.S. PATENT DOCUMENTS

| | | |
|---|---|---|
| 8,450,843 B2 | 5/2013 | Sasaki et al. |
| 2001/0008778 A1 | 7/2001 | Interrante et al. |
| 2003/0218243 A1 | 11/2003 | Chen |
| 2010/0096738 A1 | 4/2010 | Simmons-Matthews et al. |
| 2010/0127345 A1* | 5/2010 | Sanders ............. H01L 21/6835 257/528 |
| 2011/0068466 A1* | 3/2011 | Chen et al. .................. 257/737 |
| 2011/0177655 A1 | 7/2011 | Chiou et al. |
| 2012/0106117 A1 | 5/2012 | Sundaram et al. |
| 2012/0139068 A1* | 6/2012 | Stacey ................. B81C 1/0023 257/417 |
| 2013/0264720 A1* | 10/2013 | Chun .................... H01L 23/481 257/774 |

FOREIGN PATENT DOCUMENTS

| | | |
|---|---|---|
| JP | 2009260098 A | 11/2009 |
| TW | 201025544 A | 7/2010 |

\* cited by examiner

SUBSTRATE COMPRISING IMPROVED VIA PAD PLACEMENT IN BUMP AREA

The present application claims priority to U.S. Provisional Application No. 61/919,157, entitled "Substrate Comprising Improved Via Pad Placement in Bump Area", filed Dec. 20, 2013, which is hereby expressly incorporated by reference herein.

BACKGROUND

1. Field

Various features relate to a substrate that includes improved via pad placement in the bump area of the substrate.

2. Background

Figure 1:
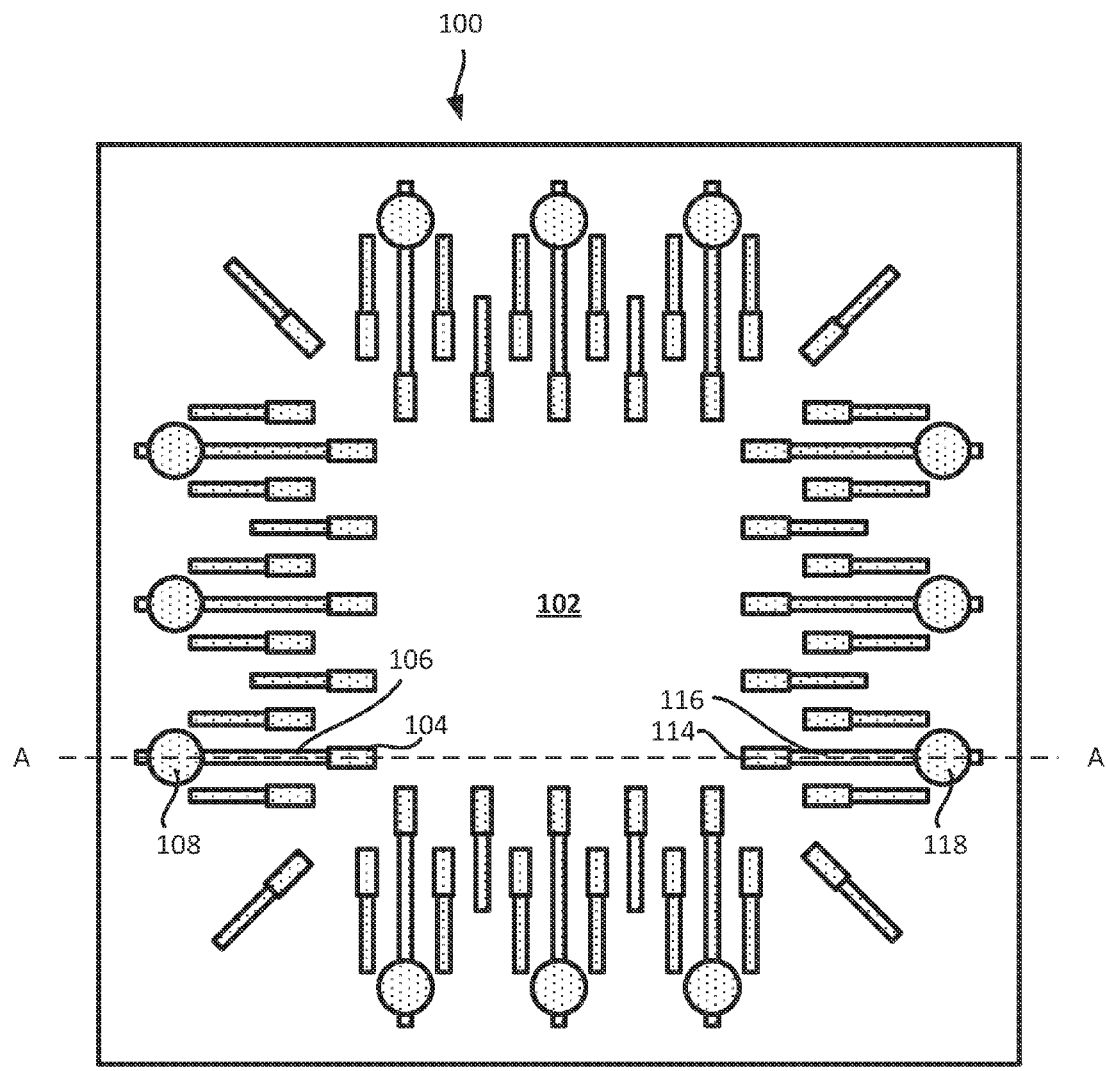

Current manufacturing techniques limit how closely traces, vias, and/or via pads can be close to each other. Because of these limitations in manufacturing techniques, dies and substrates have to be designed in a certain way. FIG. 1 illustrates how traces, vias and/or pads are implemented in current package substrates. Specifically, FIG. 1 illustrates a plan view (e.g., top view) of a package substrate 100 that includes a substrate 102, several bump pads (e.g., pads 104, 114), several traces (e.g., traces 106, 116) and several via pads (e.g., pad vias 108, 118). A bump pad is an interconnect that is configured to couple to a bump (e.g., copper pillar) from a die. The substrate 102 also includes several vias which are not visible from the plan view because these vias are covered by the via pads. These vias are coupled to the via pads. As further shown in FIG. 1, the bump pads, the via pads and/or traces are arranged in the package substrate 100 along different rows and columns. In some implementations, the package substrate 100 is configured to couple to one or more dies (e.g., flip chip).

Current manufacturing techniques create relatively large via pads (e.g., compared to the traces), which forces vias to be created towards the outer perimeter of a die coupling area of a package substrate. Moreover, current manufacturing techniques limit the pitch between traces, vias, bump pads and/or via pads. Because of these and other limitations in the manufacturing processes, a bump pad (e.g., pad 104) is coupled to a via pad (e.g., via pad 108) through a trace (e.g., trace 106). This design causes several problems. One, it creates an integrated circuit (IC) design that takes up a lot of real estate. Second, it creates performance issues, as the extra interconnect length (e.g., extra trace) can slow the electrical performance of the IC design. Three, adding additional interconnects (e.g., traces) creates a more complex IC design.

Figure 2:
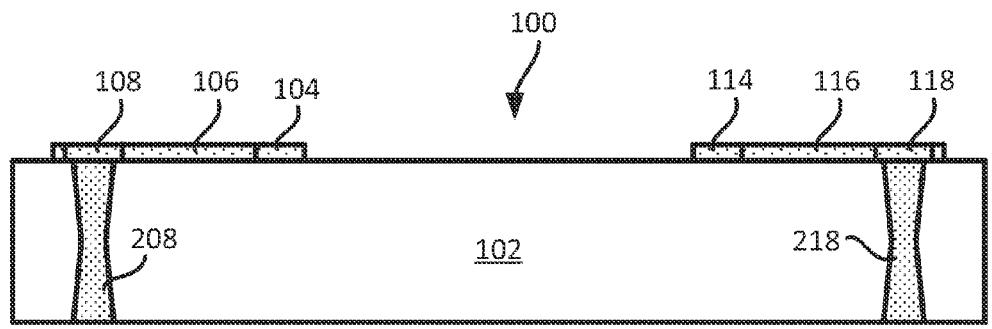

FIG. 2 illustrates a profile view (e.g., side view) of the cross-section AA of the package substrate 100 of FIG. 1. As shown in FIG. 2, the first pad 104 (e.g., bump pad), the first trace 106, and the second pad 108 (e.g., via pad) are on a first surface of the substrate 102. The package substrate 100 also includes a first via 208 that traverses the substrate 102. The first pad 104 is coupled to the first trace 106. The first trace 106 is coupled to the second pad 108. The second pad 108 is coupled to the first via 208. FIG. 2 also illustrates the third pad 114 (e.g., bump pad), the second trace 116, and the fourth pad 118 (e.g., via pad) are on the first surface of the substrate 102. The package substrate 100 also includes a second via 218 that traverses the substrate 102. The third pad 114 is coupled to the second trace 116. The second trace 116 is coupled to the fourth pad 118. The fourth pad 118 is coupled to the second via 218.

Figure 3:
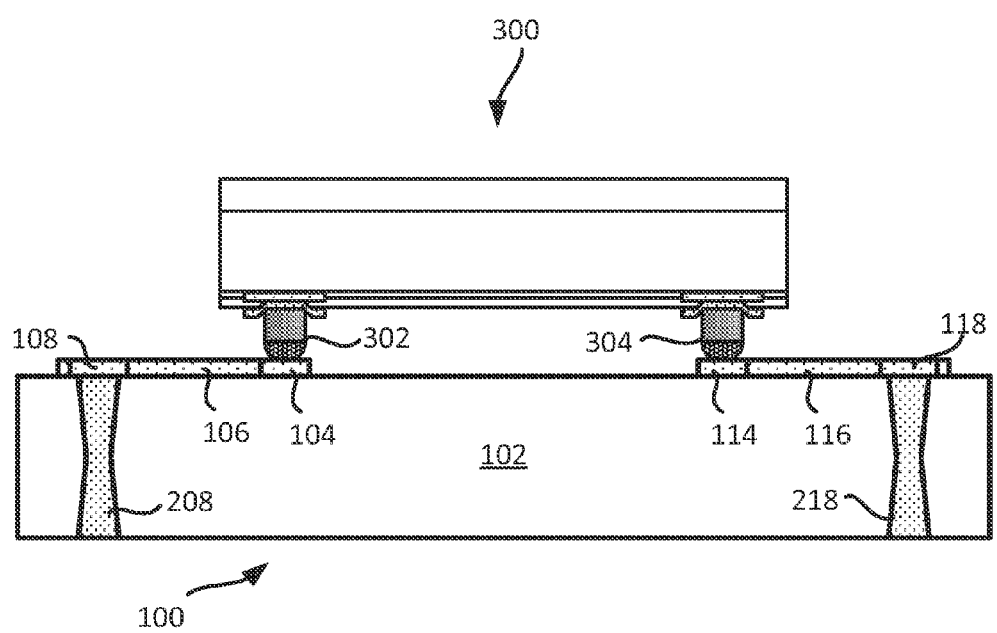

FIG. 3 illustrates how a flip chip may be coupled to a package substrate. As shown in FIG. 3, a flip chip 300 that includes a first bump 302 and a second bump 304, is coupled to the package substrate 100. The first bump 302 may include a first under bump metallization (UBM) layer, a first interconnect pillar (e.g., copper pillar), and a first solder ball. The second bump 304 may include a second under bump metallization (UBM) layer, a second interconnect pillar (e.g., copper pillar), and a second solder ball. The first bump 302 of the flip chip 300 is coupled to the first pad 104. The second bump 304 of the flip chip 300 is coupled to the third pad 114. As shown in FIG. 3, the configuration of the flip chip 300 and the package substrate 100 can create an unnecessary large package substrate 100 and/or flip chip 300. For example, there is a lot of excess lateral space/real estate between the first bump 302 and the first via 208.

Therefore, there is a need for an improved integrated device that is smaller and/or occupies a smaller real estate. Ideally, such an integrated device will have better performance than current integrated device.

SUMMARY

Various features, apparatus and methods described herein provide a package substrate that includes improved via pad placement in the bump area of the substrate.

A first example provides an integrated device that includes a substrate, a first via, and a first bump pad. The first via traverses the substrate. The first via has a first via dimension. The first bump pad is on a surface of the substrate. The first bump pad is coupled to the first via. The first bump pad has a first pad dimension that is equal or less then the first via dimension.

According to an aspect, the integrated device includes a second via traversing the substrate, where the second via has a second via dimension. The integrated device also includes a second bump pad on the surface of the substrate, where the second bump pad is coupled to the second via, where the second bump pad has a second pad dimension that is equal or less then the second via dimension. In some implementations, a pitch between the first via and the second via is about 80 microns (μm) or less. In some implementations, a pitch between the first via and the second via is about 125 microns (μm) or less.

According to one aspect, the first bump pad is configured to couple to an interconnect of a die.

According to an aspect, the first bump pad is a peripheral bump pad that is located near an edge of a die area of the substrate.

According to one aspect, the first bump pad is configured to couple to a first bump from a die. In some implementations, the first bump includes a first under metallization (UBM) layer, a first interconnect pillar, and a first solder ball.

According to an aspect, the substrate comprises one of at least a dielectric, glass, ceramic, and/or silicon.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a method for fabricating an integrated device. The method forms a substrate. The method forms a first via traversing the substrate, wherein the first via has a first via dimension. The method forms a first bump pad on a surface of the substrate such that the first bump pad is coupled to the first via, where the first bump pad has a first pad dimension that is equal or less then the first via dimension.

According to an aspect, the method further forms a second via traversing the substrate, wherein the second via has a second via dimension. The method forms a second bump pad on the surface of the substrate such that the second bump pad is coupled to the second via, where the second bump pad has a second pad dimension that is equal or less then the second via dimension. In some implementations, a pitch between the first via and the second via is about 80 microns (μm) or less. In some implementations, a pitch between the first via and the second via is about 125 microns (μm) or less.

According to one aspect, the first bump pad is configured to couple to an interconnect of a die.

According to an aspect, the first bump pad is a peripheral bump pad that is located near an edge of a die area of the substrate.

According to one aspect, the first bump pad is configured to couple to a first bump from a die. In some implementations, the first bump includes a first under metallization (UBM) layer, a first interconnect pillar, and a first solder ball.

According to an aspect, the substrate comprises one of at least a dielectric, glass, ceramic, and/or silicon.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

Figure 4:
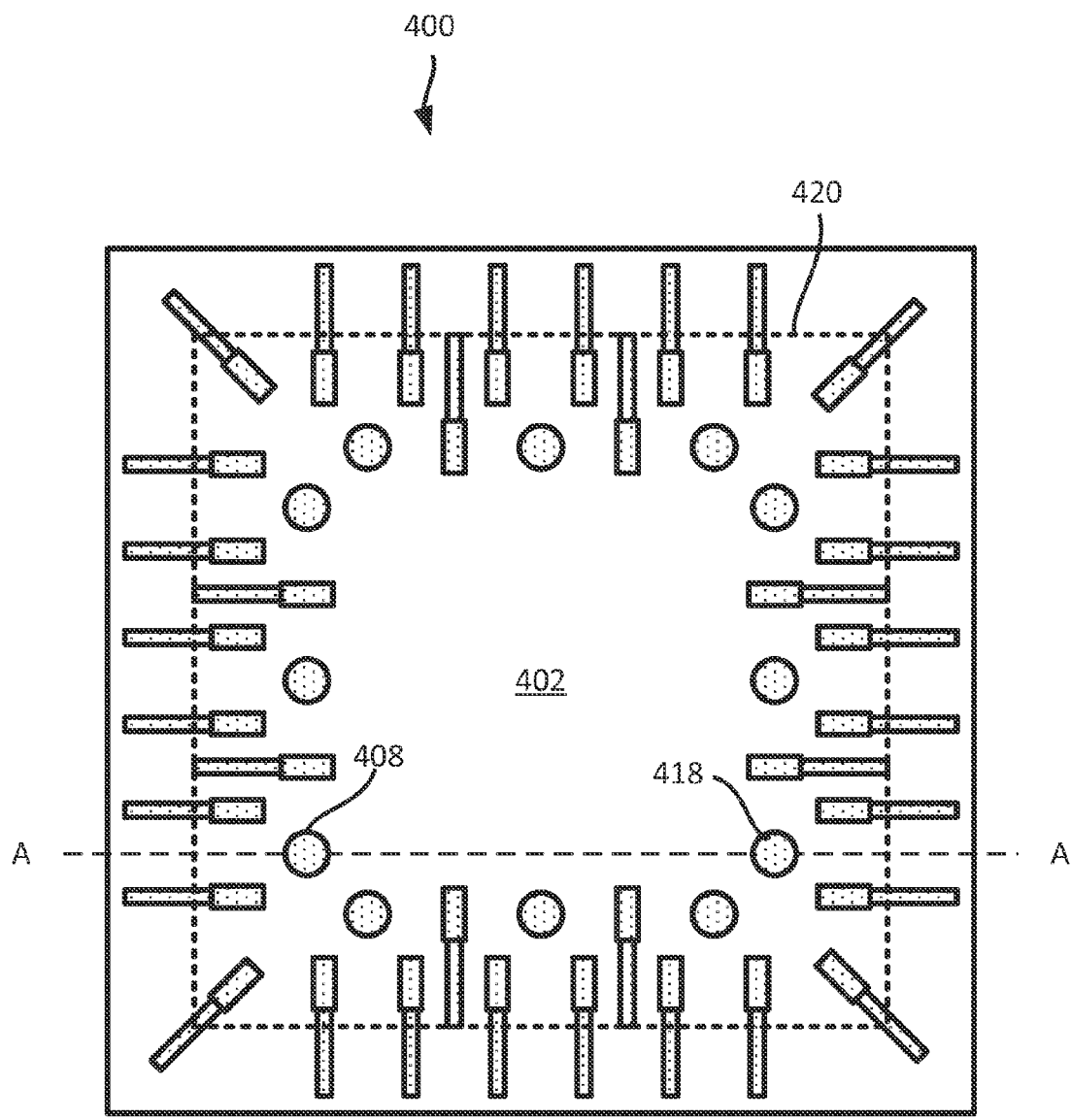
Figure 5:
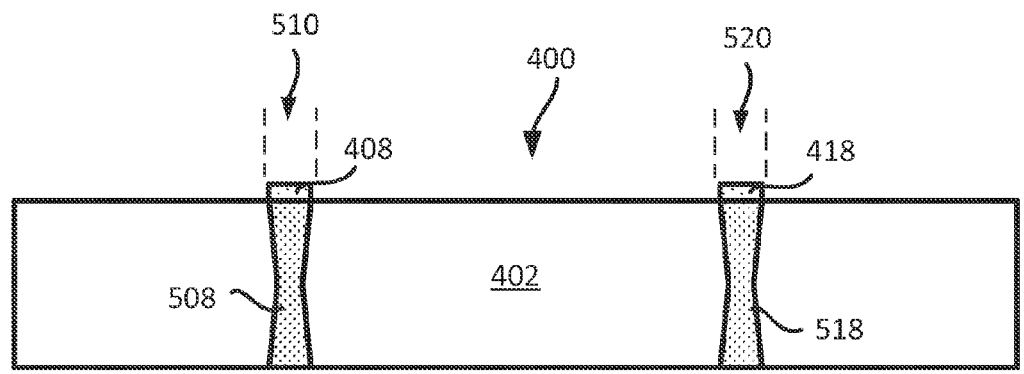
Figure 6:
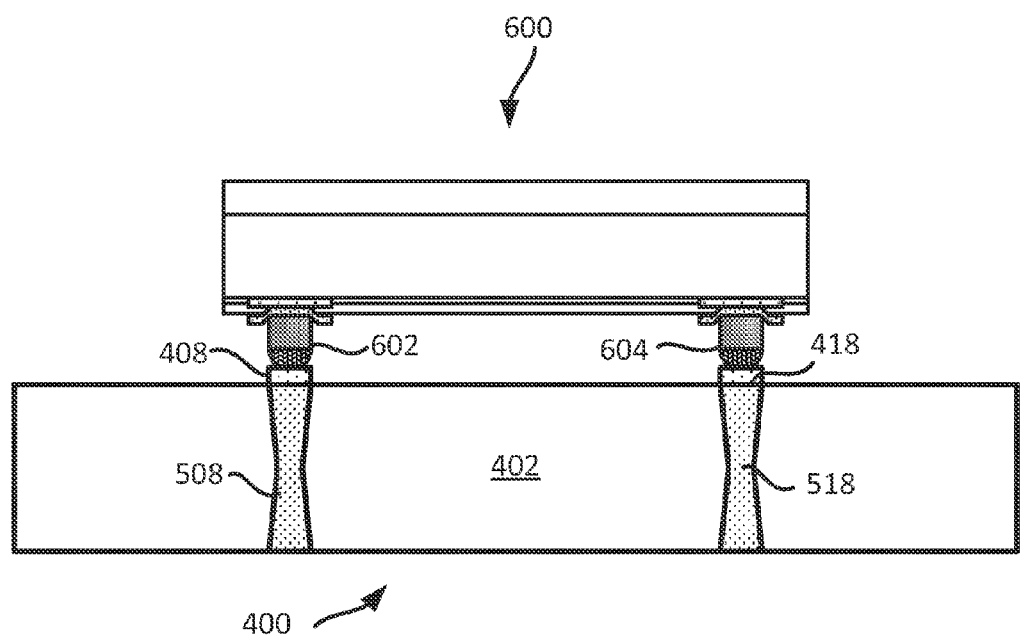
Figure 7:
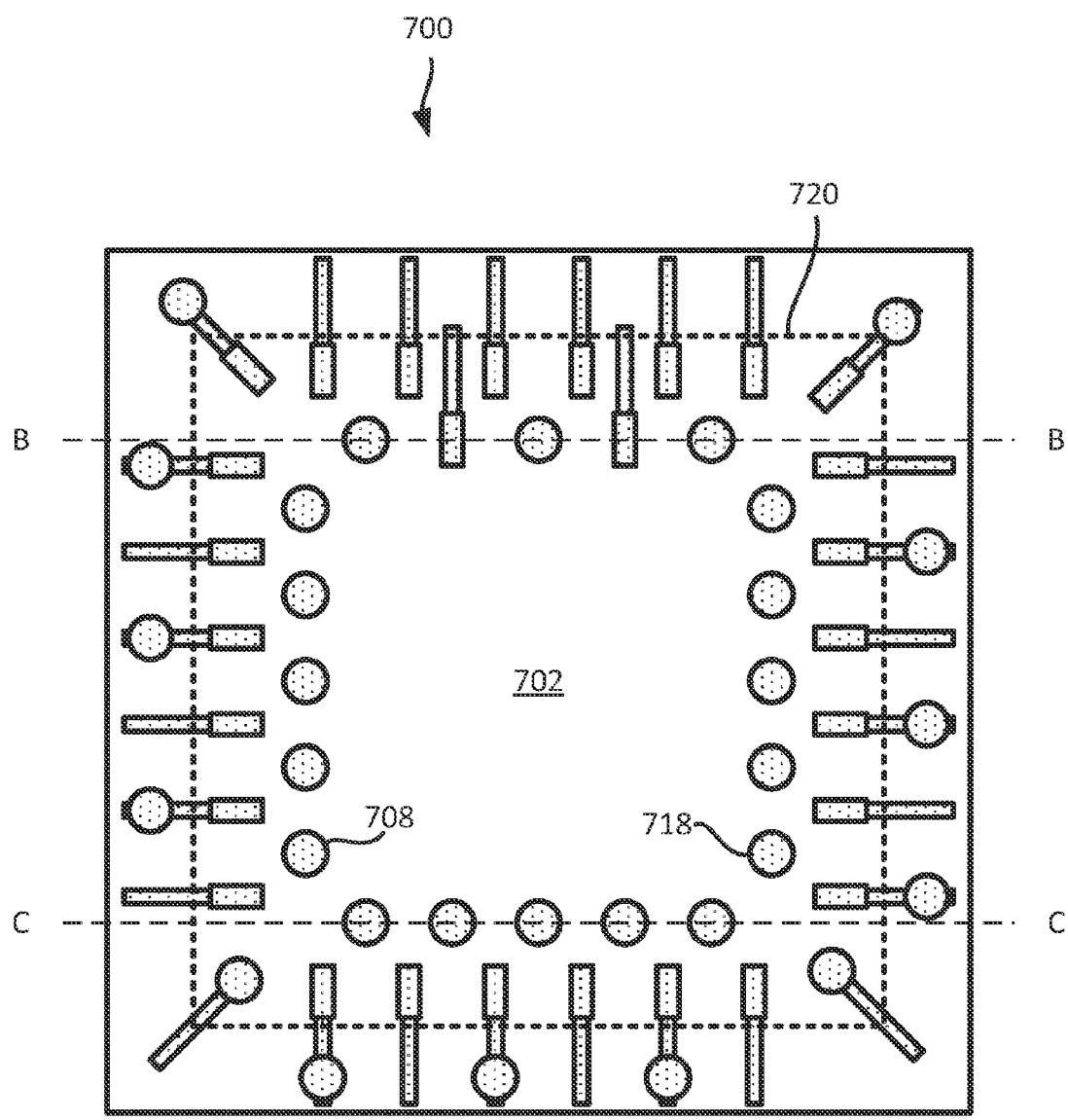
Figure 8:
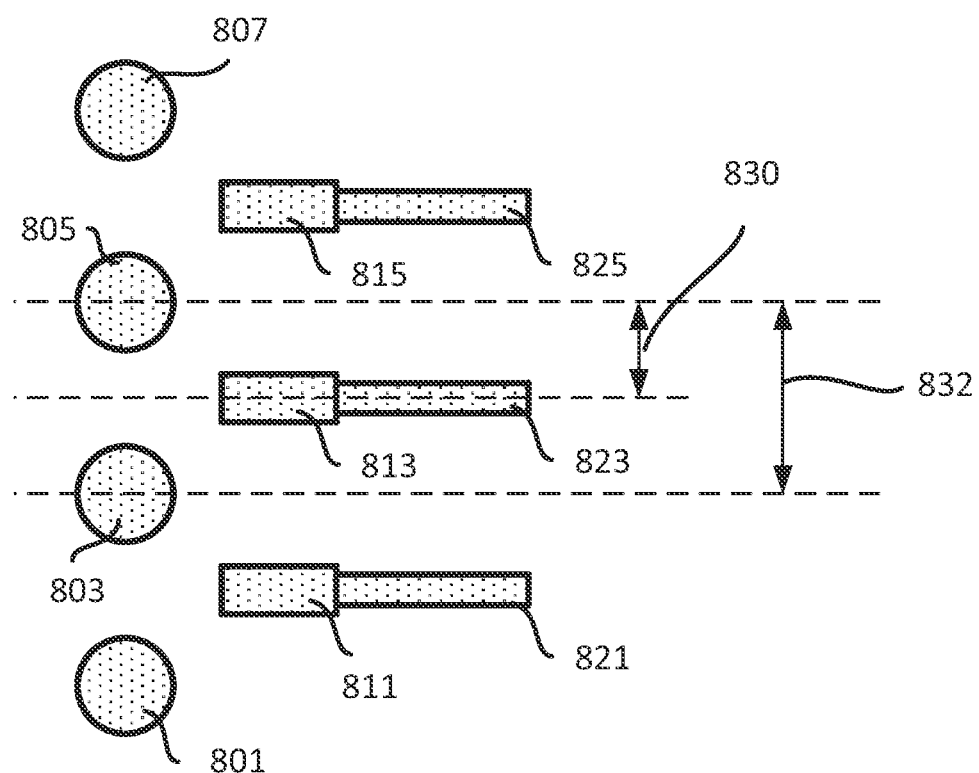
Figure 9:
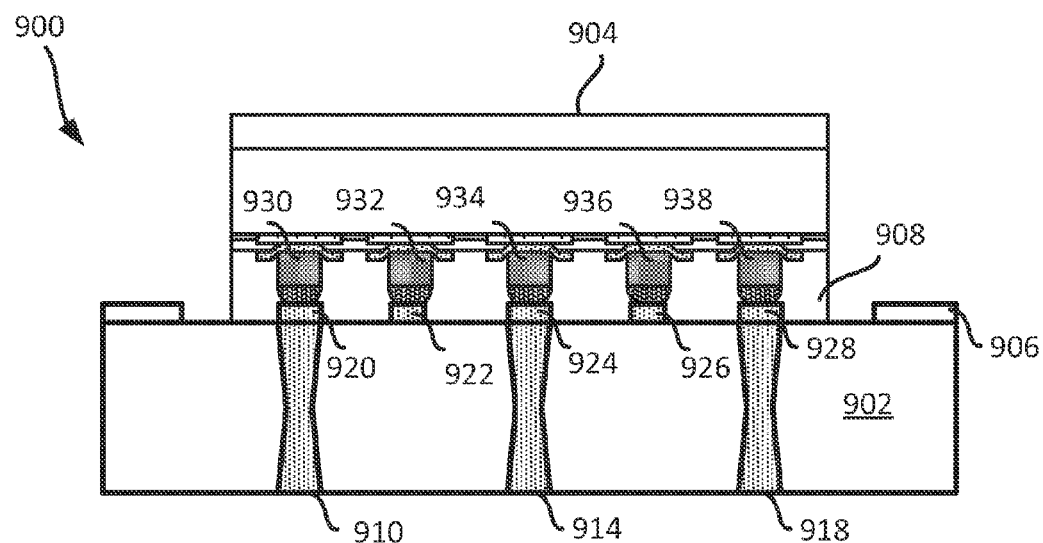
Figure 10:
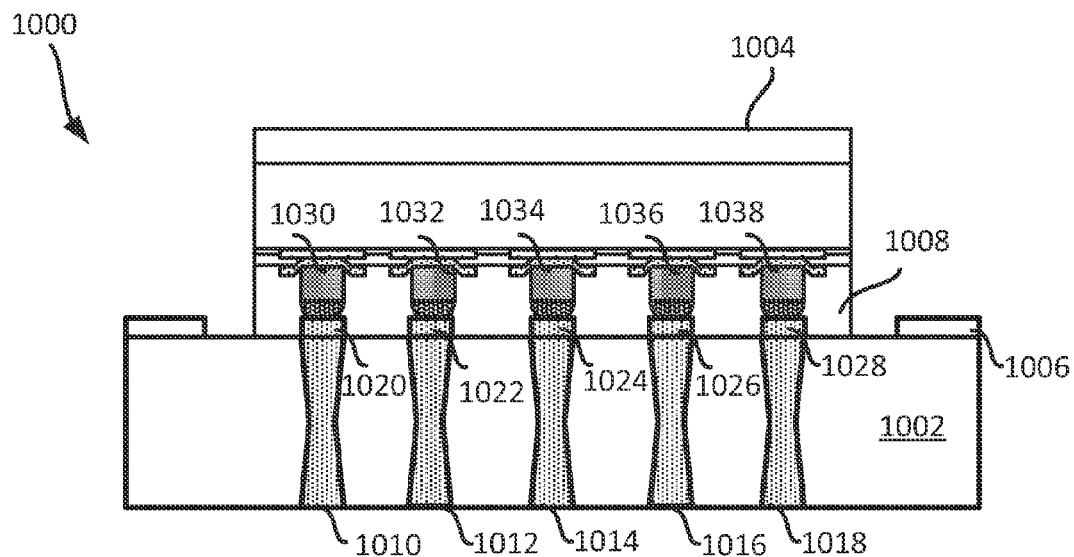
Figure 11:
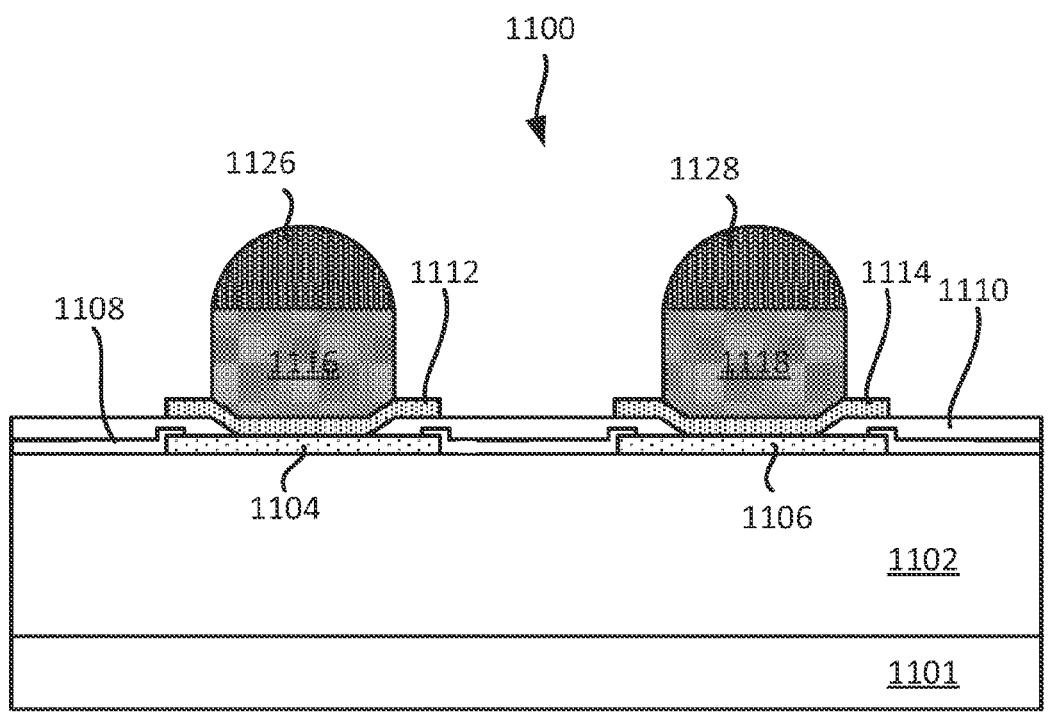
Figure 13:
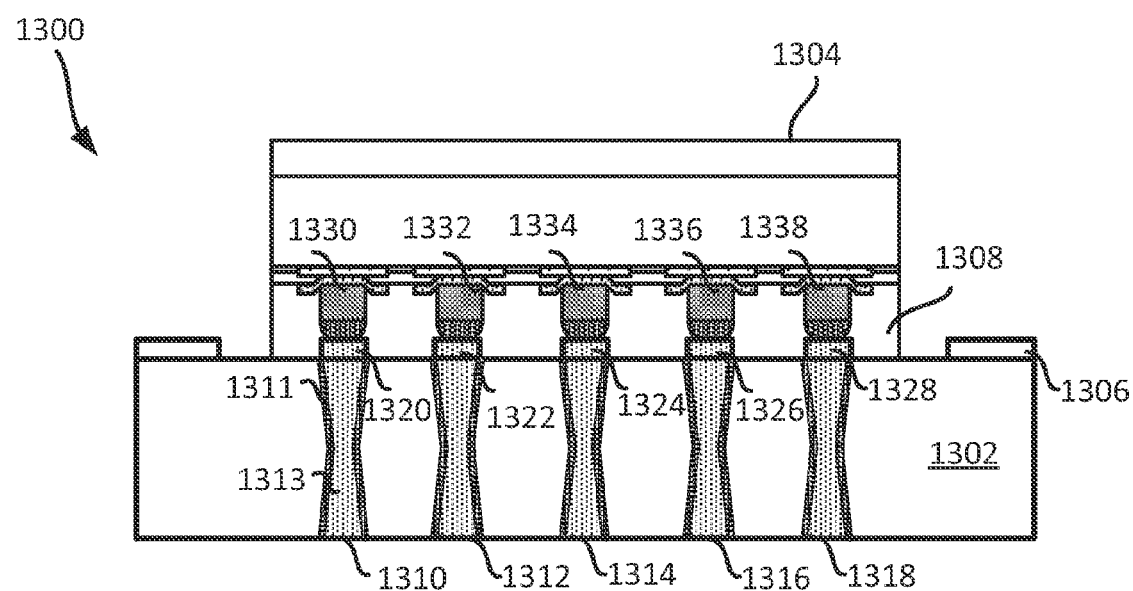
Figure 14:
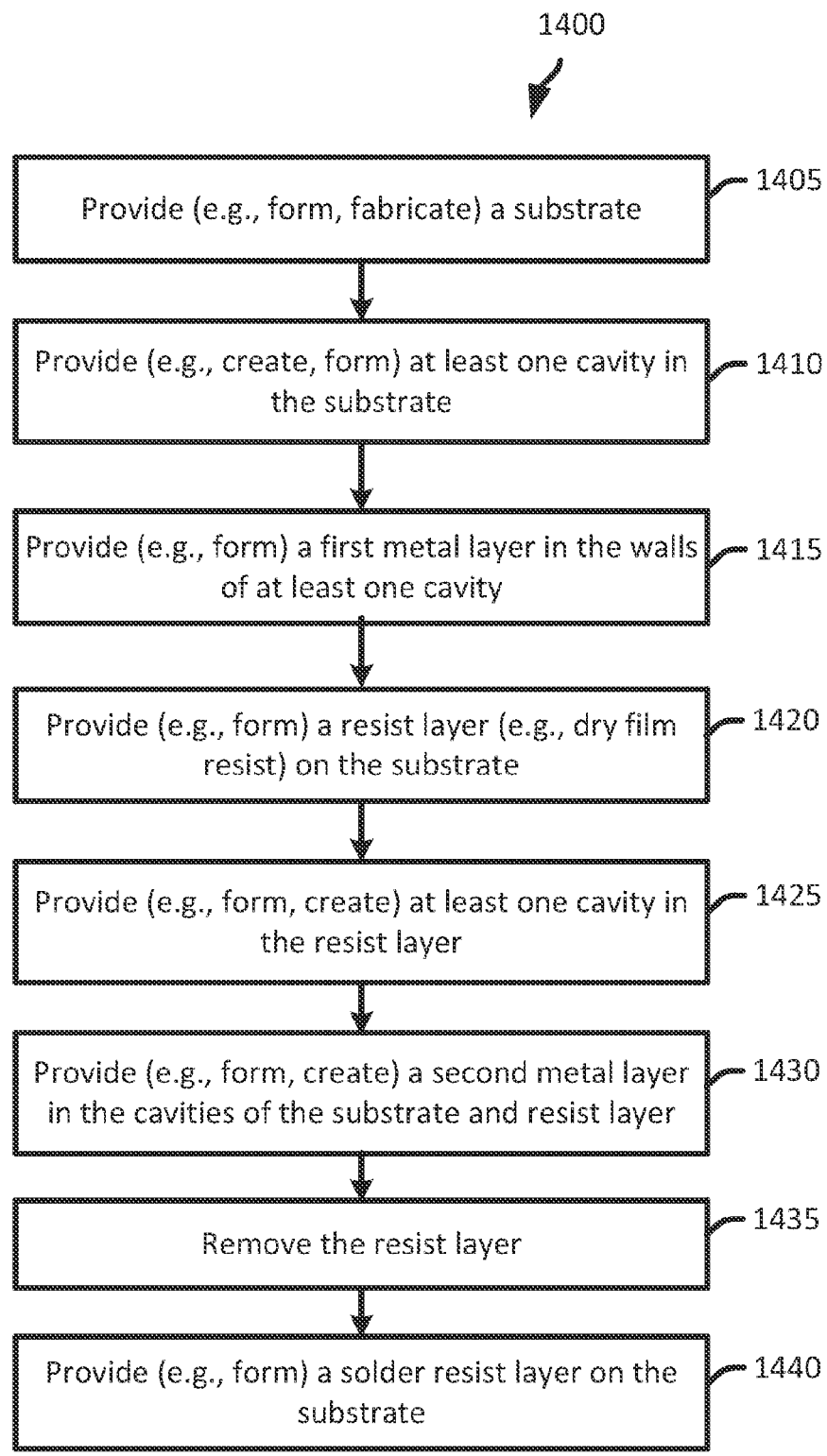
Figure 15:
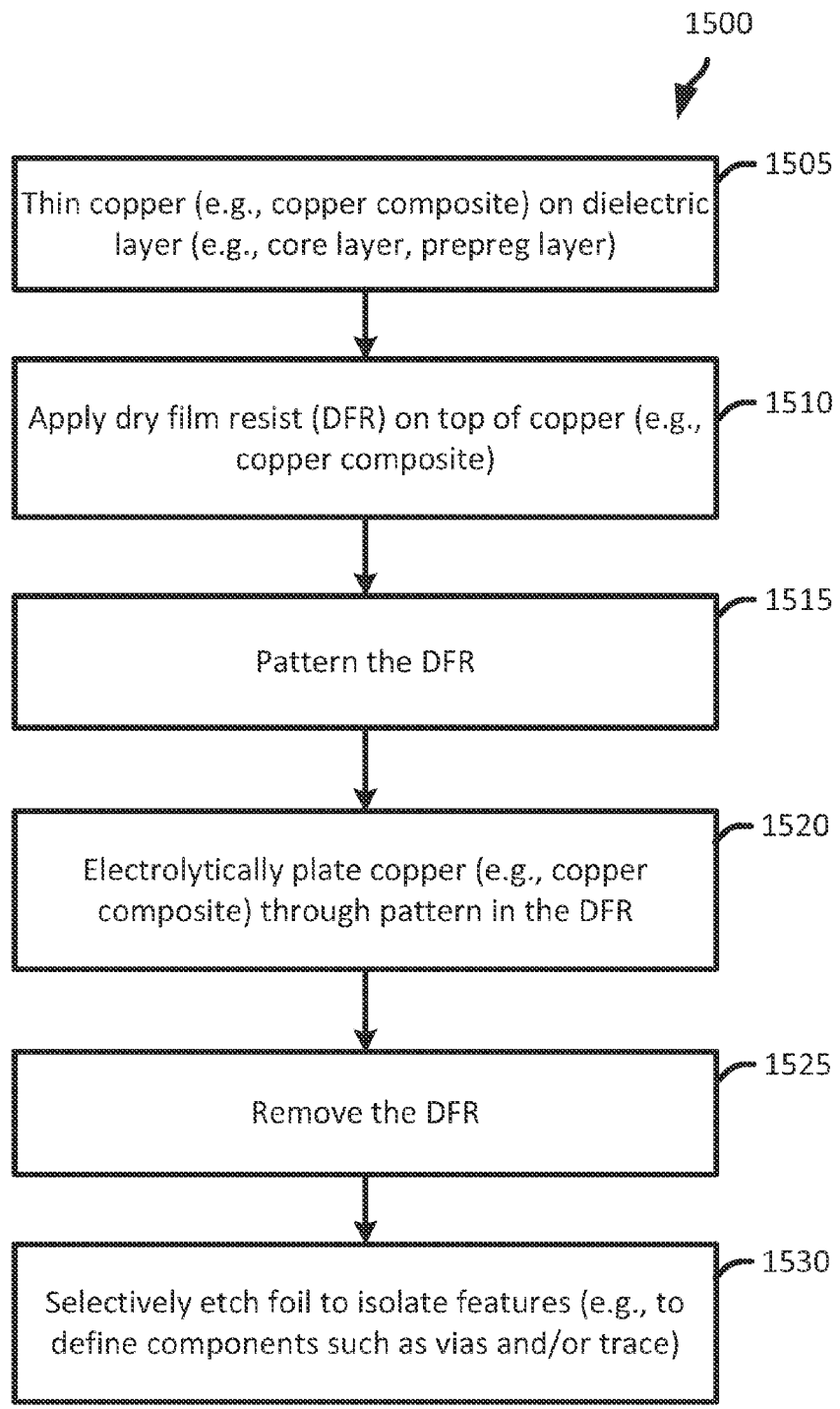
Figure 16:
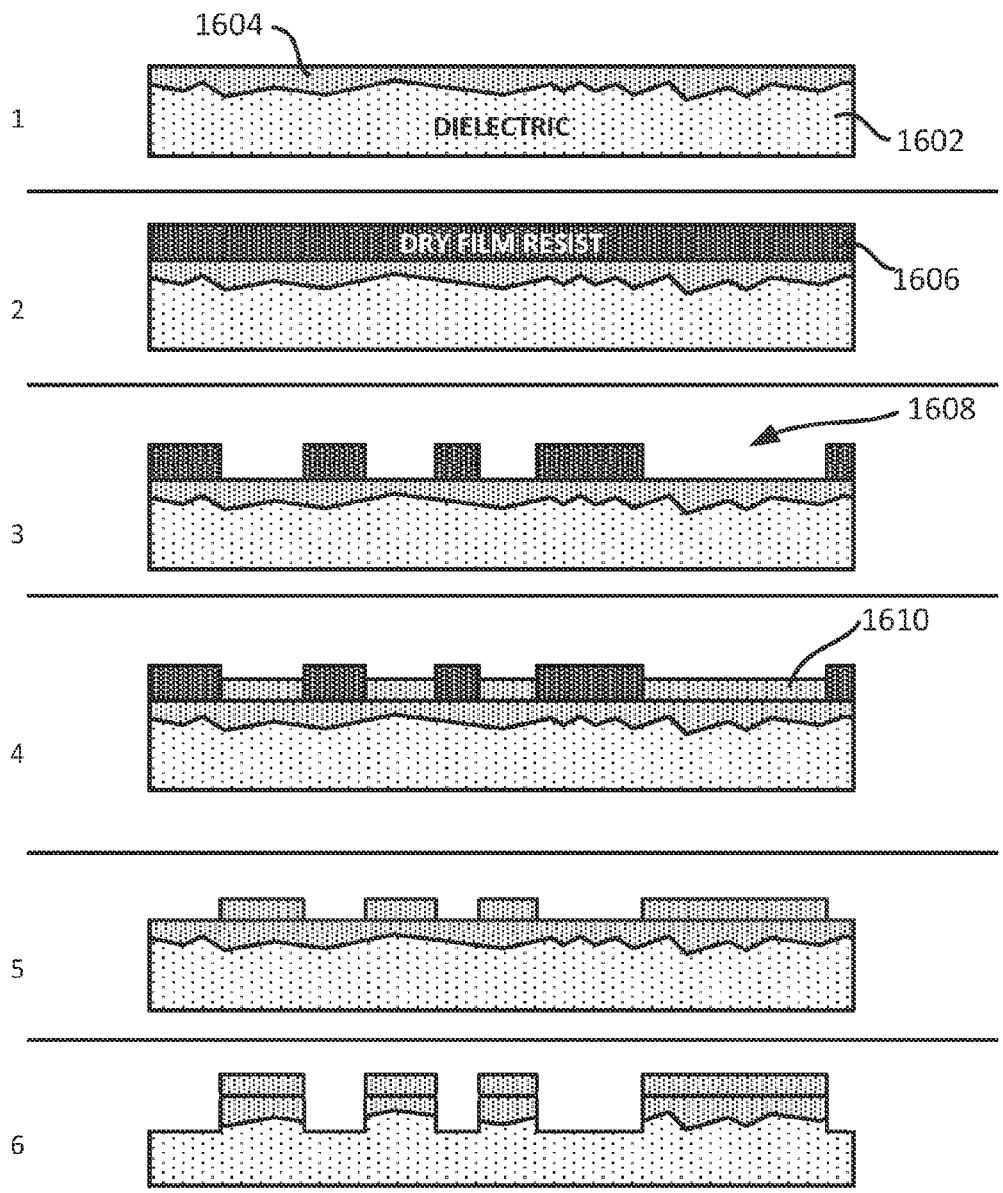
Figure 17:
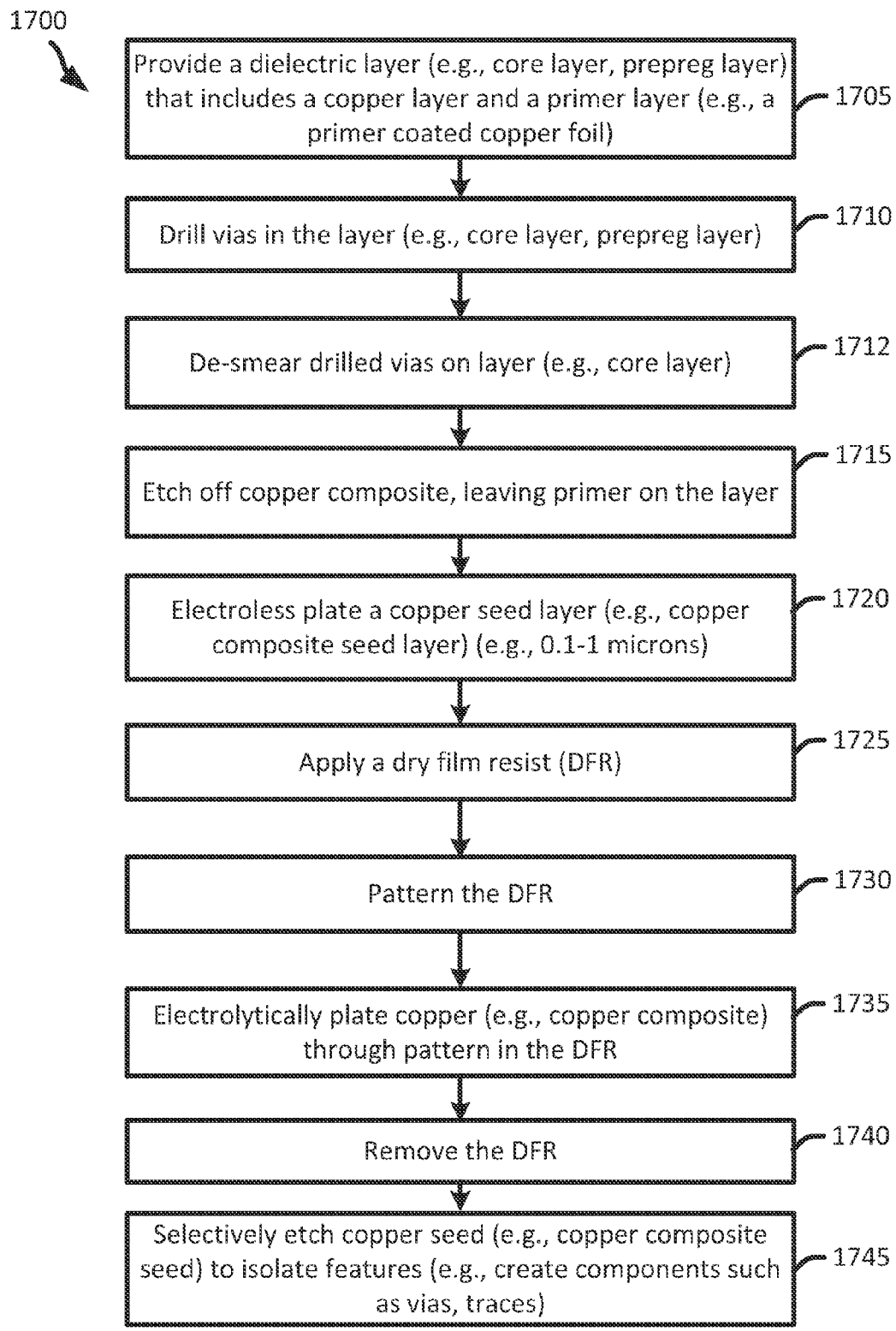
Figure 18:
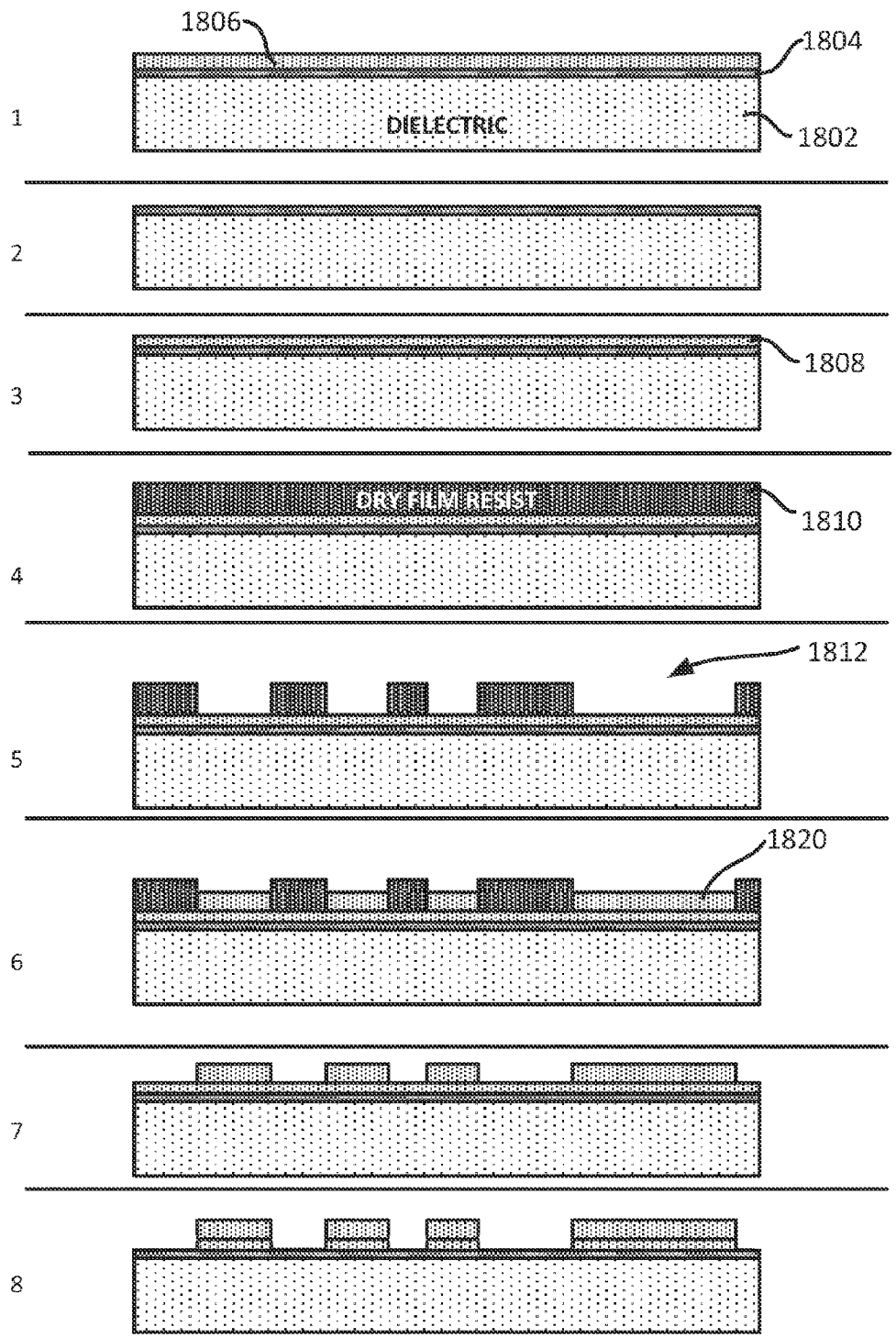
Figure 19:
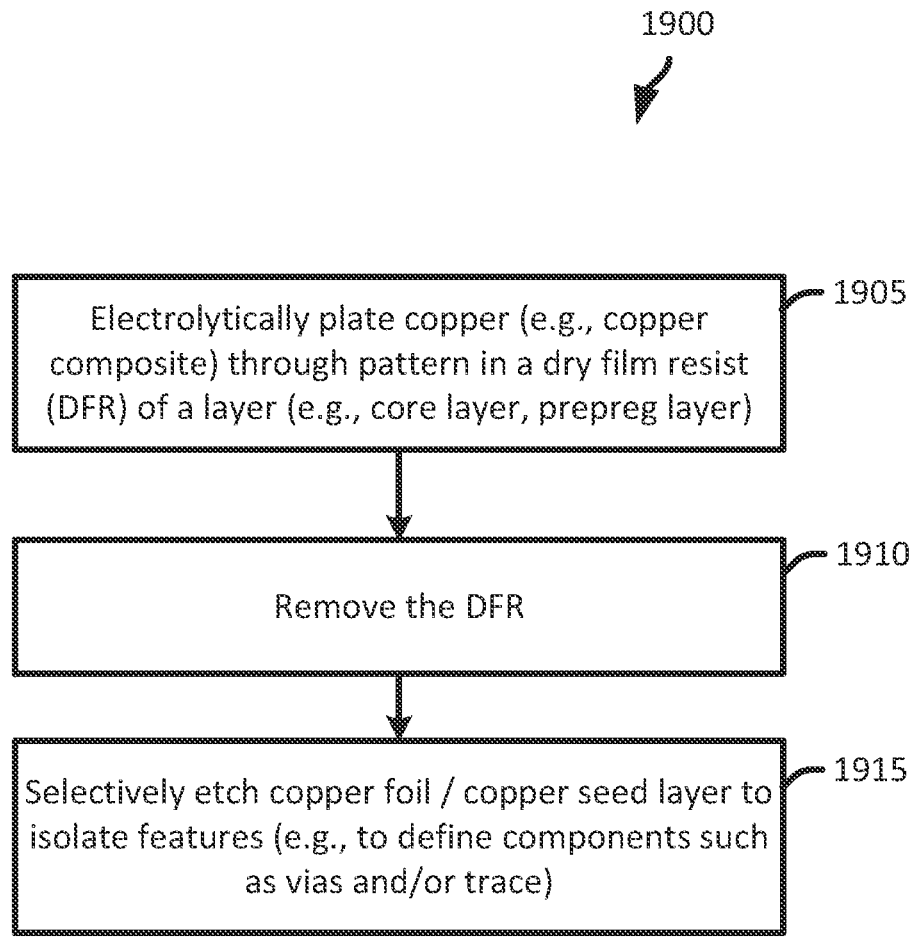
Figure 20:
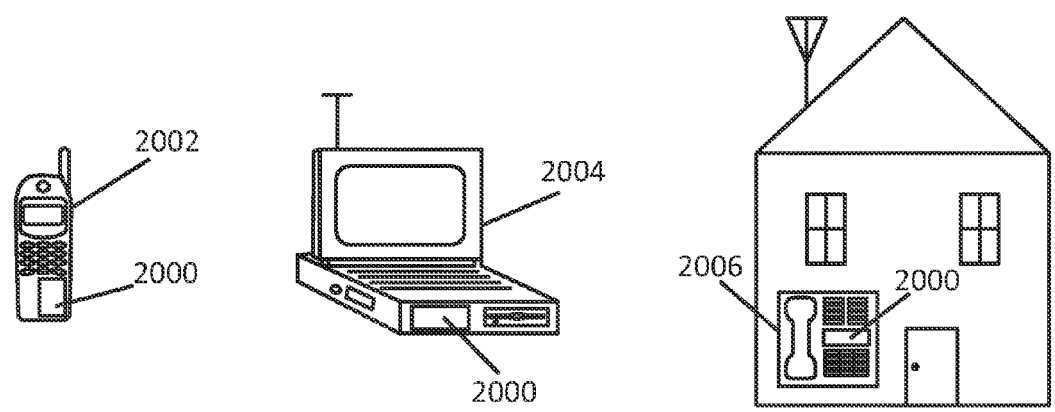

FIG. 1 illustrates a plan view of a substrate.
FIG. 2 illustrates a profile view of a substrate.
FIG. 3 illustrates a profile view of a substrate and a die.
FIG. 4 illustrates a plan view of a substrate.
FIG. 5 illustrates a profile view of a substrate.
FIG. 6 illustrates a profile view of a substrate and a die.
FIG. 7 illustrates a plan view of a substrate.
FIG. 8 illustrates a plan view of a portion of a substrate with several pitches shown.
FIG. 9 illustrates a profile view of another substrate and a die.
FIG. 10 illustrates a profile view of yet another substrate and a die.
FIG. 11 illustrates a profile view of a die.
FIG. 12 (comprising FIG. 12A, FIG. 12B, and FIG. 12C) illustrates a sequence for providing a substrate and a die.
FIG. 13 illustrates a profile view of another substrate and a die.
FIG. 14 illustrates a flow diagram of a method for providing a substrate.
FIG. 15 illustrates a flow diagram of a modified semi-additive processing (mSAP) patterning process for manufacturing a substrate.
FIG. 16 illustrates a sequence of a mSAP patterning process on a layer of a substrate.
FIG. 17 illustrates a flow diagram of a semi-additive processing (SAP) patterning process for manufacturing a substrate.
FIG. 18 illustrates a sequence of a SAP patterning process on a layer of a substrate.
FIG. 19 illustrates a flow diagram of a conceptual plating process.
FIG. 20 illustrates various electronic devices that may integrate an integrated device, substrate, and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., semiconductor device, die package) that includes a substrate, a first via, and a first bump pad. The first via traverses the substrate. The first via has a first via lateral dimension. The first bump pad is on a surface of the substrate. The first bump pad is coupled to the first via. The first bump pad has a first pad lateral dimension that is equal or less then the first via lateral dimension. In some implementations, the first bump pad is a peripheral bump pad that is located near an edge of a die area (e.g., flip chip area) of the substrate. In some implementations, the integrated device includes a second via and a second bump pad. The second via traverses the substrate. The second via has a second via lateral dimension. The second bump pad is on the surface of the substrate. The second bump pad is coupled to the second via. The second bump pad has a second pad lateral dimension that is equal or less then the second via lateral dimension. In some implementations, a pitch between the first via and the second via is about 40 microns (μm) or more. In some implementations, a pitch between the first via and the second via is about 80 microns (μm) or less. In some implementations, a pitch between the first via and the second via is about 125 microns (μm) or less. In some implementations, a pitch between the first bump pad and the second bump pad is about 125 microns (μm) or less. In some implementations, a pitch is defined as a center to center distance between two neighboring interconnects. Examples of pitches are further described in FIG. 8.

Exemplary Package Substrate Comprising Via Pad in Bump Area

FIG. 4 illustrates a plan view (e.g., top view) of a package substrate 400 that includes a substrate 402 and several interconnects (e.g., first interconnects 408, 418). An interconnect may include traces, pads and/or vias. The interconnects 408 and 418 pads that are located on a first surface of the substrate 402. In some implementations, the interconnects 408 and 418 are via pads and bump pads. The interconnects 408 and 418 are coupled to vias (e.g., through substrate vias) in the substrate 402. These vias are not visible from the plan view since the interconnects 408 and 418 are the same size (e.g., same lateral dimension) as the cross-section of the vias. In some implementations, the interconnects 408 and 418 may have a smaller cross-section than the cross-section of the vias. In such instances, these vias may be visible from a plan view. Examples of vias will be further described in FIG. 5.

The interconnects 408 and 418 may be configured to couple to bumps (e.g., interconnect pillar) of a die (which will be further described below in FIG. 6). In some implementations, the interconnects 408 and 418 are peripheral bump pads that are located near an edge of a die area 420 of the substrate. In some implementations, the die area 420 of the substrate 400 is a bump area of the substrate 400. In some implementations, the bump area of the substrate 400 is an area of the substrate that a die covers or is located above the substrate when a die is coupled to the substrate. In some implementations, the size of the via in the substrate is preserved while reducing the size of the via pads (e.g., reducing the pitch of via pads) that are coupled to vias near an edge and/or periphery of a die area of the substrate.

Different implementations may use different materials for the substrate 402. In some implementations, the substrate 402 is one of at least silicon, glass, ceramic, and/or dielectric. In some implementations, the package substrate 400 is configured to couple to one or more dies (e.g., flip chip). FIG. 4 also illustrates a first bump area and a second bump area. In some implementations, a bump area is a region or portion of a substrate that a bump (e.g., interconnect pillar) from a die will couple to when a die is coupled to the substrate. In some implementations, the first bump area corresponds to the area of the interconnect 408 (e.g., bump pad). In some implementations, the second bump area corresponds to the area of the interconnect 418 (e.g., bump pad).

As further shown in FIG. 4, the interconnects (e.g., pads, traces) are arranged in the package substrate 400 along different rows and columns Different implementations may use different spacing and/or pitch between interconnects. In some implementations, a pitch between two neighboring/adjacent interconnects is about 125 microns (μm) or less. In some implementations, a pitch between two neighboring/adjacent interconnects is about 80 microns (μm) or less. In some implementations, a pitch between two neighboring/adjacent interconnects is about 40 microns (μm) or more. In some implementations, a pitch is defined as a center to center distance between two adjacent/neighboring interconnects (e.g., traces, vias and/or pads). In some implementations, a pitch is defined as a center to center distance between two adjacent/neighboring traces, vias and/or pads, where the adjacent/neighboring traces, vias and/or pads are in a same column of traces, vias, and/or pads. In some implementations, a pitch is defined as a center to center distance between two adjacent/neighboring traces, vias and/or pads, where the adjacent/neighboring traces, vias and/or pads are in a same row of traces, vias, and/or pads.

Each of the interconnects (e.g., pads, traces) of the package substrate 400 has at least one dimension (e.g., width, length, diameter). In some implementations, a first dimension (e.g., width) of a trace is the same or less than a first dimension (e.g., diameter) of a via. In some implementations, a first dimension (e.g., width) of a pad (e.g., via pad, bump pad) is the same or less than a first dimension (e.g., diameter) of a via.

It should be noted that for the same column of vias, the vias are located in alternating rows (e.g., non-adjacent rows) of vias. Similarly, it should be noted that for the same row of vias, the vias are located in alternating columns (e.g., non-adjacent columns) of vias. For example, for vias in a first column, these vias would be located in a first row, a third row, and/or a fifth row. In another example, for vias in a first row, these vias would be located in a first column, a third column, and/or a fifth column. However, vias may be located in adjacent rows and/or columns of vias.

It should be noted that for the same column of via pads, the via pads are located in alternating rows (e.g., non-adjacent rows) of via pads. Similarly, it should be noted that for the same row of via pads, the via pads are located in alternating columns (e.g., non-adjacent columns) of via pads. For example, for via pads in a first column, these via pads would be located in a first row, a third row, and/or a fifth row. In another example, for via pads in a first row, these via pads would be located in a first column, a third column, and/or a fifth column. However, via pads may be located in adjacent rows and/or columns of via pads.

As shown in FIG. 4, at least some of the bump pads are directly coupled to a via. As such, at least some of the bump pads bypass a trace when coupled to a via. Moreover, the pads are configured to operate as both a bump pad and a via pad. FIG. 4 illustrates that the first interconnect 408 (e.g., bump pad) is directly coupled to a first via (not visible). Similarly, FIG. 4 illustrates that a second interconnect 418 (e.g., bump pad) is directly coupled to a second via (not visible). When the first interconnect 408 is directly coupled to the first via, the first interconnect bypasses any intermediate traces. Similarly, when the second interconnect 418 is directly coupled to the second via, the second interconnect bypasses any traces. The reduction of an intermediate trace between the interconnect and the via, shortens the electrical path, thereby increasing the performance of the integrated circuit (IC) design, and also reduces the complexity of the IC design.

FIG. 5 illustrates a profile view (e.g., side view) of the cross-section AA of the package substrate 400 of FIG. 4. As shown in FIG. 5, the first interconnect 408 and the second interconnect 418 are on a first surface of the substrate 402. In some implementations, the first interconnect 408 and the second interconnect 418 are bump interconnects (e.g., bump pad) configured to couple to a bump (e.g., interconnect pillar) from a die (e.g., flip chip). FIG. 5 illustrates that the substrate 402 includes a first via 508 and a second via 518. Each of the first via 508 and the second via 518 traverses the substrate 402. The first interconnect 408 is directly coupled to the first via 508. In some implementations, the size (e.g., lateral dimension) of the first interconnect 408 is the same or less than the cross-sectional size (e.g., lateral dimension) of the first via 508. The second interconnect 418 is directly coupled to the second via 518. In some implementations, the size (e.g., lateral dimension) of the second interconnect 418 is the same or less than the cross-sectional size (e.g., lateral dimension) of the second via 518. FIG. 5 also illustrates a first bump area 510 and a second bump area 520. In some implementations, the first bump area 510 corresponds to the size of the first interconnect 408. In some implementations, the second bump area 520 corresponds to the size of the second interconnect 418.

In some implementations, the first via 508 includes a first metal layer and a second metal layer. In some implementations, the first metal layer is a seed metal layer. In some implementations, the first metal layer is an electroless metal layer. In some implementations, the second via 518 includes a first metal layer and a second metal layer. In some implementations, the first metal layer is a seed metal layer. In some implementations, the first metal layer is an electroless metal layer. Examples of first and second metal layers for the vias are described in FIGS. 12A-12C.

FIG. 6 illustrates how a die may be coupled to a package substrate. As shown in FIG. 6, a die 600 (e.g., flip chip, bare die) that includes a first bump 602 and a second bump 604, is coupled to the package substrate 400. The first bump 602 may include a first under bump metallization (UBM) layer, a first interconnect pillar (e.g., copper pillar), and a first solder ball. The second bump 604 may include a second under bump metallization (UBM) layer, a second interconnect pillar (e.g., copper pillar), and a second solder ball. The first bump 602 of the die 600 is coupled to the first interconnect 408. The second bump 604 of the die 600 is coupled to the second interconnect 418. As shown in FIG. 6, the first bump 602 is coupled to the first interconnect 404 such that the first bump 602 is vertically (e.g., partially, substantially, completely) over the first via 508 of the substrate 402. Similarly, the second bump 604 is coupled to the second interconnect 418 such that the second bump 604 is vertically (e.g., partially, substantially, completely) over the second via 518 of the substrate 402. In some implementations, the first bump 602 is coupled to the first interconnect 408 without short-circuiting an electrical signal that traverses the first interconnect 408. In some implementations, the second bump 604 is coupled to the second interconnect 418 without short-circuiting an electrical signal that traverses the second interconnect 418.

As show in FIG. 6, the first via 508 is located in the first bump area 510 of the substrate. Similarly, the second via 518 is located in the second bump area 520 the substrate. In some implementations, a bump area is defined as an area of the substrate (e.g., area or portion of the substrate) that a bump from a die will couple to. The first bump area 510 includes portions of the first interconnect 408 that will couple with the first bump 602 of the die 600. In some implementations, the first via 508 is underneath the first bump area 510. The second bump area 520 includes portions of the second interconnect 418 that will couple with the second bump 604 of the die 600. In some implementations, the second via 518 is underneath the second bump area 520.

Different implementations may have different positions and/or configurations for the vias and/or via pads in a package substrate.

FIG. 7 illustrates a plan view (e.g., top view) of a package substrate 700 that includes a substrate 702 and several interconnects (e.g., interconnects 708, 718). An interconnect may include traces, pads and/or vias. The interconnects 708 and 718 pads that are located on a first surface of the substrate 702. In some implementations, the interconnects 708 and 718 are via pads and bump pads. The interconnects 708 and 718 are coupled to vias (e.g., through substrate vias) in the substrate 402. These vias are not visible from the plan view since the interconnects 708 and 718 are the same size as the cross-section of the vias. In some implementations, the interconnects 708 and 718 may have a smaller cross-section than the cross-section of the vias. In such instances, these vias may be visible from a plan view.

The interconnects 708 and 718 may be configured to couple to bumps (e.g., interconnect pillar) of a die (which will be further described below in FIGS. 9 and 10). In some implementations, the interconnects 708 and 718 are peripheral bump pads that are located near an edge of a die area 720 of the substrate. In some implementations, the die area 720 of the substrate 700 is a bump area of the substrate 700. In some implementations, the bump area of the substrate 700 is an area of the substrate that a die covers or is located above the substrate when a die is coupled to the substrate. In some implementations, the size of the via in the substrate is preserved while reducing the size of the via pads (e.g., reducing the pitch of via pads) that are coupled to vias near an edge and/or periphery of a die area of the substrate.

Different implementations may use different materials for the substrate 702. In some implementations, the substrate 702 is one of at least silicon, glass, ceramic, and/or dielectric. In some implementations, the package substrate 700 is configured to couple to one or more dies (e.g., flip chip). FIG. 7 also illustrates a first bump area and a second bump area. In some implementations, a bump area is a region or portion of a substrate that a bump (e.g., interconnect pillar) from a die will couple to when a die is coupled to the substrate. In some implementations, the first bump area corresponds to the area of the interconnect 708 (e.g., bump pad). In some implementations, the second bump area corresponds to the area of the interconnect 718 (e.g., bump pad).

As further shown in FIG. 7, the interconnects (e.g., pads, traces) are arranged in the package substrate 700 along different rows and columns Different implementations may use different spacing and/or pitch between interconnects. In some implementations, a pitch between two neighboring/adjacent interconnects is about 125 microns (μm) or less. In some implementations, a pitch between two neighboring/adjacent interconnects is about 80 microns (μm) or less. In some implementations, a pitch between two neighboring/adjacent interconnects is about 40 microns (μm) or more. In some implementations, a pitch is defined as a center to center distance between two adjacent/neighboring interconnects (e.g., traces, vias and/or pads). In some implementations, a pitch is defined as a center to center distance between two adjacent/neighboring traces, vias and/or pads, where the adjacent/neighboring traces, vias and/or pads are in a same column of traces, vias, and/or pads. In some implementations, a pitch is defined as a center to center distance between two adjacent/neighboring traces, vias and/or pads, where the adjacent/neighboring traces, vias and/or pads are in a same row of traces, vias, and/or pads.

Each of the interconnects (e.g., pads, traces) of the package substrate 700 has at least one dimension (e.g., width, length, diameter). In some implementations, a first dimension (e.g., width) of a trace is the same or less than a first dimension (e.g., diameter) of a via. In some implementations, a first dimension (e.g., width) of a pad (e.g., via pad, bump pad) is the same or less than a first dimension (e.g., diameter) of a via.

FIG. 8 illustrates how a pitch may be defined in some implementations. FIG. 8 illustrates a substrate that includes a first via pad 801, a second via pad 803, a third via pad 805, a fourth via pad 807, a first bump pad 811, a second bump pad 813, a third bump pad 815, a first interconnect 821, a second interconnect 823, and a third interconnect 825. FIG. 8 also illustrates a first pitch 830 and a second pitch 832. In some implementations, a first pitch (e.g., first pitch 830) is a center to center distance between two adjacent/neighboring interconnects (e.g., vias, traces, pads) on different rows or columns. For example, the first pitch 830 may be a center to center distance between the third via pad 805 and the second bump pad 813 or the second interconnect 823. In some implementations, the first pitch 830 may be about 40 microns (μm) or more.

In some implementations, a second pitch (e.g., second pitch 832) is a center to center distance between two neighboring/adjacent interconnects (e.g., vias, traces, pads) on the same row or column. For example, the second pitch 832 may be a center to center distance between the second via pad 803 and the third via pad 805. In another example, the second pitch may be a center to center distance between the first bump 811 and the second bump 813. In another example, a second pitch may be a center to center distance between the second via pad 803 and the second bump pad 813 or the second interconnect 823. In another example, a first pitch may be a center to center distance between the second interconnect 823 and the third interconnect 825. In some implementations, the second pitch 832 may be about 80 microns (μm) or less.

Different implementations may have different dimensions for the traces, vias, and/or via pads. For example, in some implementations, a trace may have a width of about 10 microns (μm)-30 microns (μm). In some implementations, a via may have a width of about 50 microns (μm)-75 microns (μm). In some implementations, a via pad may have a width of about 75 microns (μm) or less. It should be noted that the above dimensions are merely examples, and the dimensions of the traces, vias, and/or via pads in the present disclosure should not be limited to what is described.

FIG. 9 illustrates a profile view (e.g., side view) of the cross-section BB of the package substrate 700 of FIG. 7 coupled to a die. As shown in FIG. 9, a package 900 includes a substrate 902, a die 904, a solder resist layer 906, and an under fill 908. In some implementations, the die 904 is a flip chip and/or a bare die.

The package substrate 902 includes a first via 910, a second via 914, a third via 918, a first interconnect 920, a second interconnect 924, a third interconnect 928, a first pad 922, and a second pad 926. The solder resist layer 906 is coupled to a first surface of the substrate 902. The first interconnect 920, the second interconnect 924, the third interconnect 928, the first pad 922, and the second pad 926 are on the first surface of the substrate 902.

The first interconnect 920 is coupled to the first via 910. The first interconnect 920 is a pad (e.g., bump pad, via pad). The first interconnect 920 has a first dimension (e.g., width) that is the same or less than a first dimension (e.g., width) of the first via 910. The second interconnect 924 is coupled to the second via 914. The second interconnect 924 is a pad (e.g., bump pad, via pad). The second interconnect 924 has a first dimension (e.g., width) that is the same or less than a first dimension (e.g., width) of the second via 914. The third interconnect 928 is coupled to the third via 918. The third interconnect 928 is a pad (e.g., bump pad, via pad). The third interconnect 928 has a first dimension (e.g., width) that is the same or less than a first dimension (e.g., width) of the third via 918. The under fill 908 is between the substrate 902 and the die 904.

The die 904 includes a first bump 930, a second bump 932, a third bump 934, a fourth bump 936, and a fifth bump 938. Each of the bump may include at least an under bump metallization (UBM) layer, an interconnect pillar (e.g., copper pillar), and a solder ball. As shown in FIG. 9, the first bump 930 is coupled to the first interconnect 920 such that the first bump 930 is vertically (e.g., partially, substantially, completely) over the first via 910. The second bump 932 is coupled to the first pad 922. The third bump 934 is coupled to the second interconnect 924 such that the third bump 934 is vertically (e.g., partially, substantially, completely) over the second via 914. The fourth bump 936 is coupled to the second pad 926. The fifth bump 938 is coupled to the third interconnect 928 such that the fifth bump 938 is vertically (e.g., partially, substantially, completely) over the third via 918. In some implementations, the first bump 930 is coupled to the first interconnect 920 without short-circuiting the electrical signal that traverses the first interconnect 920. In some implementations, the second bump 932 is coupled to the second interconnect 922 without short-circuiting the electrical signal that traverses the second interconnect 922. In some implementations, the third bump 934 is coupled to the third interconnect 924 without short-circuiting the electrical signal that traverses the third interconnect 924. In some implementations, the fourth bump 936 is coupled to the fourth interconnect 926 without short-circuiting the electrical signal that traverses the fourth interconnect 926. In some implementations, the fifth bump 938 is coupled to the fifth interconnect 928 without short-circuiting the electrical signal that traverses the fifth interconnect 928.

In some implementations, the first via 910 includes a first metal layer and a second metal layer. In some implementations, the first metal layer is a seed metal layer. In some implementations, the first metal layer is an electroless metal layer. In some implementations, the second via 914 includes a first metal layer and a second metal layer. In some implementations, the first metal layer is a seed metal layer. In some implementations, the first metal layer is an electroless metal layer. In some implementations, the third via 918 includes a first metal layer and a second metal layer. In some implementations, the first metal layer is a seed metal layer. In some implementations, the first metal layer is an electroless metal layer. Examples of first and second metal layers for the vias are described in FIGS. 12A-12C.

FIG. 10 illustrates a profile view (e.g., side view) of the cross-section CC of the package substrate 700 of FIG. 7 coupled to a die. As shown in FIG. 10, a package 1000 includes a substrate 1002, a die 1004, a solder resist layer 1006, and an under fill 1008. In some implementations, the die 1004 is a flip chip and/or a bare die.

The package substrate 1002 includes a first via 1010, a second via 1012, a third via 1014, a fourth via 1016, a fifth via 1018, a first interconnect 1020, a second interconnect 1022, a third interconnect 1026, a fourth interconnect 1026, and a fifth interconnect 1028. The solder resist layer 1006 is coupled to a first surface of the substrate 1002. The first interconnect 1020, the second interconnect 1022, the third interconnect 1024, the fourth interconnect 1026, and the fifth interconnect 1028 are on the first surface of the substrate 1002.

The first interconnect 1020 is coupled to the first via 1010. The first interconnect 1020 is a pad (e.g., bump pad, via pad). The first interconnect 1020 has a first dimension (e.g., width) that is the same or less than a first dimension (e.g., width) of the first via 1010. The second interconnect 1022 is coupled to the second via 1012. The second interconnect 1022 is a pad (e.g., bump pad, via pad). The second interconnect 1022 has a first dimension (e.g., width) that is the same or less than a first dimension (e.g., width) of the second via 1012. The third interconnect 1024 is coupled to the third via 1014. The first interconnect 1020 is a pad (e.g., bump pad, via pad). The third interconnect 1024 has a first dimension (e.g., width) that is the same or less than a third dimension (e.g., width) of the third via 1014. The fourth interconnect 1026 is coupled to the fourth via 1026. The fourth interconnect 1026 is a pad (e.g., bump pad, via pad). The fourth interconnect 1026 has a first dimension (e.g., width) that is the same or less than a first dimension (e.g., width) of the fourth via 1016. The fifth interconnect 1028 is coupled to the fifth via 1018. The fifth interconnect 1028 is a pad (e.g., bump pad, via pad). The fifth interconnect 1028 has a first dimension (e.g., width) that is the same or less than a first dimension (e.g., width) of the fifth via 1018. The under fill 1008 is between the substrate 1002 and the die 1004.

The die 1004 includes a first bump 1030, a second bump 1032, a third bump 1034, a fourth bump 1036, and a fifth bump 1038. Each of the bump may include at least an under bump metallization (UBM) layer, an interconnect pillar (e.g., copper pillar), and a solder ball. As shown in FIG. 10, the first bump 1030 is coupled to the first interconnect 1020 such that the first bump 1030 is vertically (e.g., partially, substantially, completely) over the first via 1010. The second bump 1032 is coupled to the second interconnect 1022 such that the second bump 1032 is vertically (e.g., partially, substantially, completely) over the second via 1012. The third bump 1034 is coupled to the third interconnect 1024 such that the third bump 1034 is vertically (e.g., partially, substantially, completely) over the third via 1014. The fourth bump 1036 is coupled to the fourth interconnect 1026 such that the fourth bump 1036 is vertically (e.g., partially, substantially, completely) over the fourth via 1016. The fifth bump 1038 is coupled to the fifth interconnect 1028 such that the fifth bump 1038 is vertically (e.g., partially, substantially, completely) over the fifth via 1018.

In some implementations, the first via 1010 includes a first metal layer and a second metal layer. In some implementations, the first metal layer is a seed metal layer. In some implementations, the first metal layer is an electroless metal layer. In some implementations, the second via 1012 includes a first metal layer and a second metal layer. In some implementations, the first metal layer is a seed metal layer. In some implementations, the first metal layer is an electroless metal layer. In some implementations, the third via 1014 includes a first metal layer and a second metal layer. In some implementations, the first metal layer is a seed metal layer. In some implementations, the first metal layer is an electroless metal layer. Examples of first and second metal layers for the vias are described in FIGS. 12A-12C.

FIG. 11 conceptually illustrates an example of a die 1100 (which is a form of an integrated device). In some implementations, the die 1100 may correspond to the flip chip 600 of FIG. 6. As shown in FIG. 11, the die 1100 (e.g., integrated device, bare die) includes a substrate 1101, several lower level metal layers and dielectric layers 1102, a first pad 1104, a second pad 1106, a passivation layer 1108, a first insulation layer 1110, a first under bump metallization (UBM) layer 1112, a second under bump metallization (UBM) layer 1114, a first interconnect 1116 (e.g., first pillar interconnect), a second interconnect 1118 (e.g., second pillar interconnect), a first solder 1126, and a second solder 1128. In some implementations, the first UBM layer 1112, the first interconnect 1116, and the first solder ball 1126 may collectively be referred as a first bump for the die 1111. In some implementations, the second UBM layer 1114, the second interconnect 1118, and the second solder ball 1128 may collectively be referred as a second bump for the die.

Having provided several exemplary substrates that includes vias under a bump area, a sequence for providing/manufacturing a substrate that includes a via under a bump area will now be described below.

Exemplary Sequence for Providing a Substrate that Includes a Via in a Bump Area

FIG. 12 (which includes FIGS. 12A-12C) illustrates an exemplary sequence for providing/manufacturing/fabricating a substrate that includes a via under a bump area. It should be noted that for the purpose of clarity and simplification, the processes of FIGS. 12A-12C do not necessarily include all the steps and/or stages of manufacturing a substrate. Moreover, in some instances, several steps and/or stages may have been combined into a single step and/or stage in order to simplify the description of the processes. It should also be noted that the shapes of the patterns, pattern features, components (e.g., composite conductive trace, vias) in FIGS. 12A-12C are merely conceptual illustrations and are not intended to necessarily represent the actual shape and form of the patterns, pattern features and components. In some implementations, the sequence of FIGS. 12A-12C illustrates a process that can fabricate traces, vias, and/or via pads having dimensions that are described in the present disclosure (e.g., dimensions described in FIG. 8).

Figure 12A:
Figure 12A:
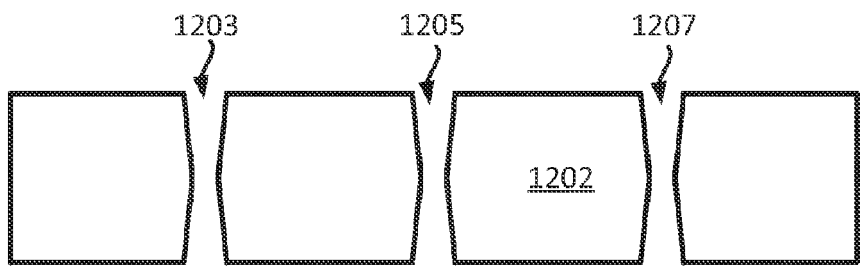
Figure 12A:
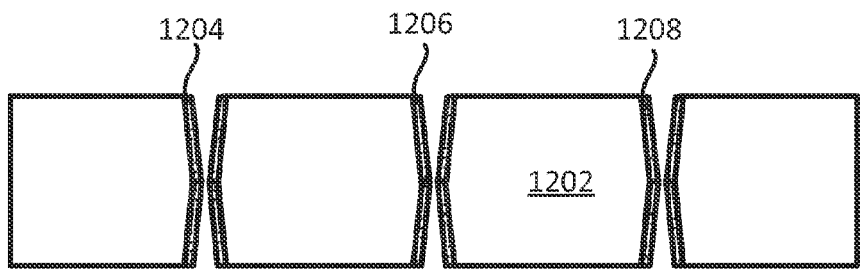

As shown in FIG. 12A, a substrate (e.g., substrate 1202) is provided (at stage 1). In some implementations, providing a substrate may include fabricating (e.g., forming) a substrate or receiving a substrate from a supplier. Different implementations may use different materials for the substrate. In some implementations, the substrate may include one of at least silicon, glass, ceramic and/or dielectric. In some implementations, the substrate may include several layers (e.g., laminate substrate that includes core layer and several prepreg layers).

Next, several cavities are provided (at stage 2) in the substrate. As shown at stage 2, a first cavity 1203, a second cavity 1205, and a third cavity 1207 are provided in the substrate 1202. The first cavity 1203, the second cavity 1205, and the third cavity 1207 traverse the substrate 1202. Different implementations may provide different manufacturing processes for providing (e.g., forming, creating) the cavities. In some implementation, the cavities are provided (at stage 2) using a laser etching process.

The wall surfaces of the cavities are plated (at stage 3) with a metal layer. As shown at stage 3, a first metal layer 1204 is plated on the wall surface of the first cavity 1203, a second metal layer 1206 is plated on the wall surface of the second cavity 1205, and a third metal layer 1208 is plated on the wall surface of the third cavity 1207. In some implementations, the first metal layer 1204, the second metal layer 1206, and the third metal layer 1208 are a seed layer (e.g., electroless metal layer). In some implementations, providing (e.g., forming, creating) the metal layers on the walls of the cavities includes using an electroless copper plating process.

Figure 12B:
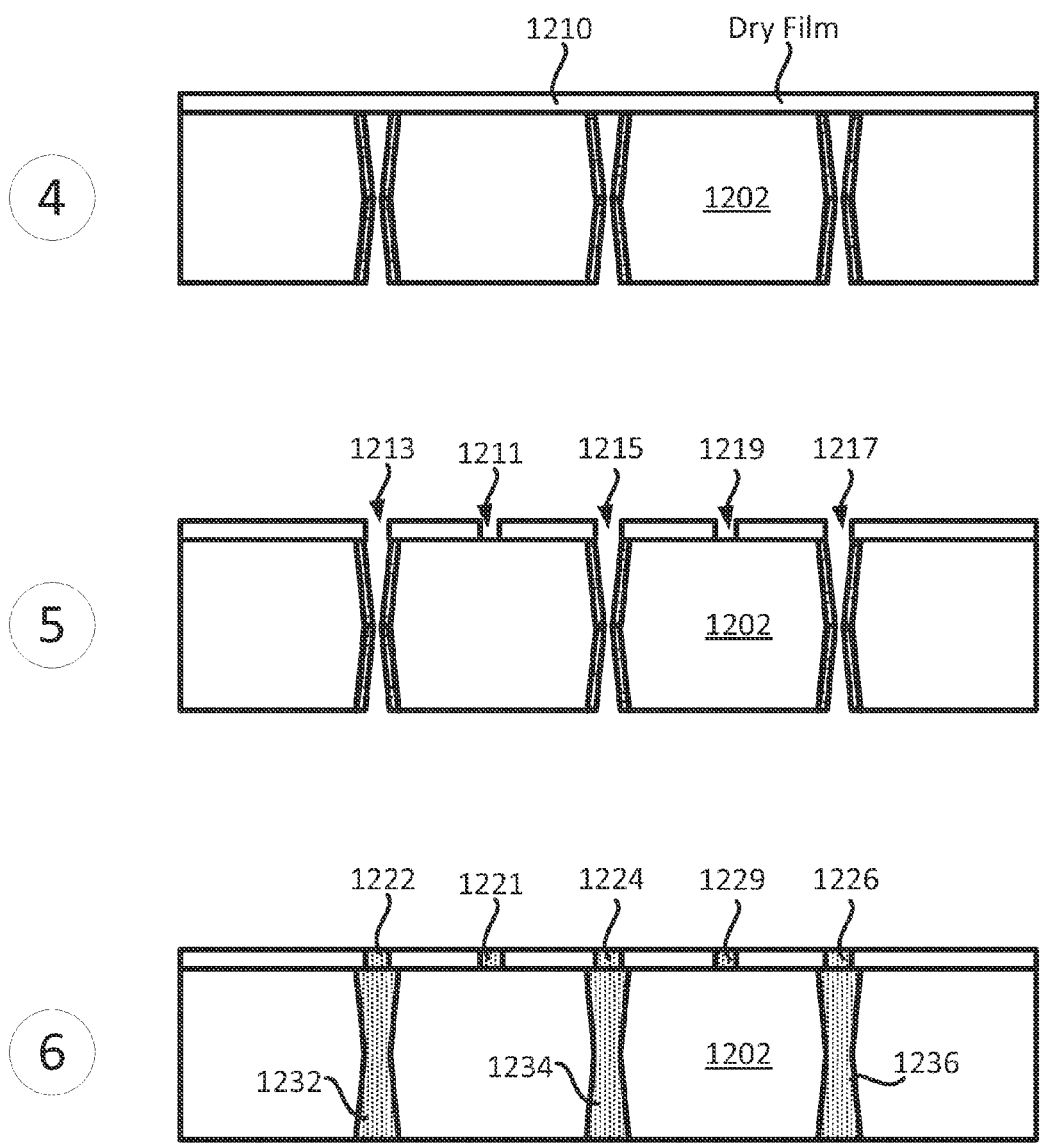

As shown in FIG. 12B, a dry film layer (e.g., dry film 1210) is provided (at stage 4) on a first surface of the substrate (e.g., substrate 1202). Next, several openings are provided (at stage 5) in the dry film layer. As shown in stage 5, a first opening 1213, a second opening 1215, a third opening 1217, a fourth opening 1211, and fifth opening 1219 are provided in the dry film layer 1210. Different implementations may provide (e.g., forming, creating) the openings differently. In some implementations, the openings are provided using exposure and development techniques. In some implementations, the openings have a dimension (e.g., width) that is equal or less then the cavities in substrate.

Several metal layers are then provided (at stage 6) in the substrate. As shown at stage 6, the first cavity 1203 is filled with metal to form the first via 1232, the second cavity 1205 is filled with metal to form the second via 1234, and the third via 1207 is filled with metal to form the third via 1236. In some implementations, the first via 1232, the second via 1234, the third via 1236 includes a first metal layer and a second metal layer. In some implementations, the first metal of the vias (e.g., via 1232) is a seed layer (e.g., metal layer 1204). In some implementations, the second metal layer of the vias (e.g., via 1234) is a copper metal layer that is coupled to the first metal layer.

In addition, the first opening 1213, the second opening 1215, the third opening 1217, the fourth opening 1211, and the fifth opening 1219 are filled with metal to respectively form, a first interconnect 1222, a second interconnect 1224, a third interconnect 1226, a fourth interconnect 1221, and a fifth interconnect 1229. In some implementations, providing (at stage 6) the metal includes using an electrolytic plating process. In some implementations, the interconnects 1221, 1222, 1224, 1226 and 1229 have a size (e.g., lateral dimension) that is the same or less than the cross-sectional size of a via. For example, in some implementations, the size (e.g., width) of the interconnect 1222 is the same or less than the cross-sectional size (e.g., width) of the via 1232.

Figure 12C:
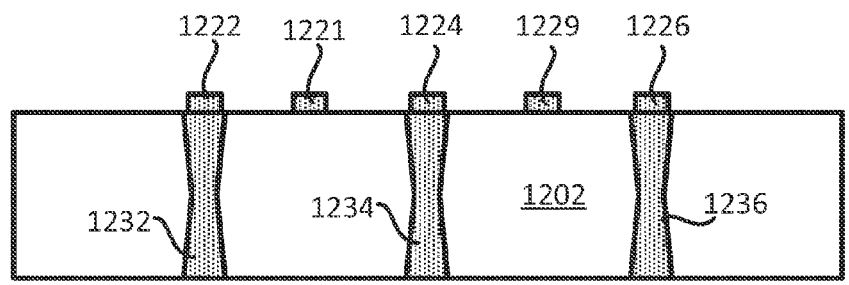
Figure 12C:
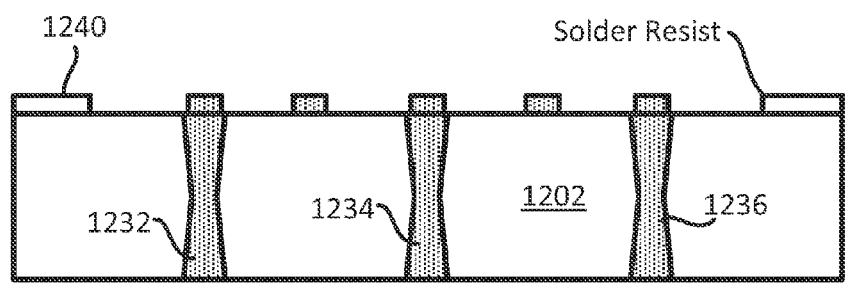
Figure 12C:
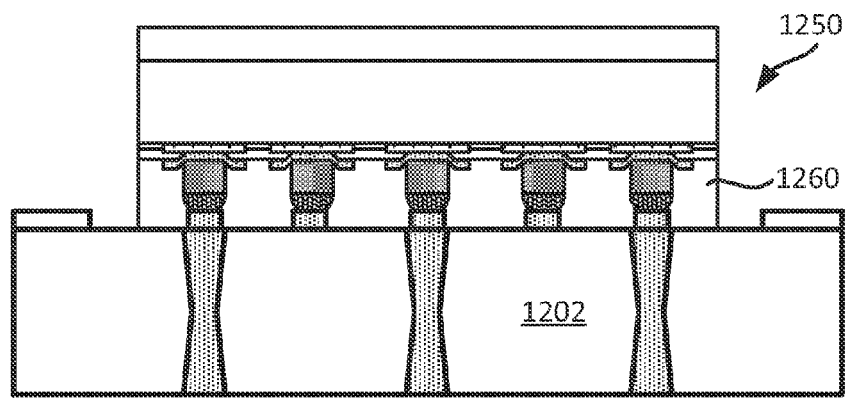

As shown in FIG. 12C, the dry film layer (e.g., dry film 1210) is removed (at stage 7). In some implementations, removing (at stage 7) the dry film includes etching away any remaining dry film.

A solder resist layer (e.g., solder resist 1240) is selectively provided (at stage 8) on the substrate. Different implementations may selectively provide the solder resist layer. In some implementations, selectively providing (e.g., forming, creating) the solder resist layer includes providing the solder resist layer, flash etching, and/or back end processing.

A die is provided and coupled (at stage 9) to the substrate. In some implementations, the die is a flip chip. The die includes several bumps. As shown at stage 9, the die is coupled to the substrate such a first bump is coupled to a first interconnect, where the first bump is at least partially vertically over the first via. Stage 9 also illustrates an under fill 1260 is between the substrate 1202 and the die 1250.

Exemplary Package Substrate Comprising Via Pad in Bump Area

FIG. 13 illustrates a profile view (e.g., side view) of a package substrate. As shown in FIG. 13, a package 1300 includes a substrate 1302, a die 1304, a solder resist layer 1306, and an under fill 1308. In some implementations, the die 1304 is a flip chip.

The package substrate 1302 includes a first via 1310, a second via 1312, a third via 1314, a fourth via 1316, a fifth via 1318, a first interconnect 1320, a second interconnect 1322, a third interconnect 1326, a fourth interconnect 1326, and a fifth interconnect 1328. The solder resist layer 1306 is coupled to a first surface of the substrate 1302. The first interconnect 1320, the second interconnect 1322, the third interconnect 1324, the fourth interconnect 1326, and the fifth interconnect 1328 are on the first surface of the substrate 1302.

The first interconnect 1320 is coupled to the first via 1310. The first interconnect 1320 is a pad (e.g., bump pad, via pad). The first interconnect 1320 has a first dimension (e.g., width) that is the same or less than a first dimension (e.g., width) of the first via 1310. The second interconnect 1322 is coupled to the second via 1312. The second interconnect 1322 is a pad (e.g., bump pad, via pad). The second interconnect 1322 has a first dimension (e.g., width) that is the same or less than a first dimension (e.g., width) of the second via 1312. The third interconnect 1324 is coupled to the third via 1314. The first interconnect 1320 is a pad (e.g., bump pad, via pad). The third interconnect 1324 has a first dimension (e.g., width) that is the same or less than a third dimension (e.g., width) of the third via 1314. The fourth interconnect 1326 is coupled to the fourth via 1326. The fourth interconnect 1326 is a pad (e.g., bump pad, via pad). The fourth interconnect 1326 has a first dimension (e.g., width) that is the same or less than a first dimension (e.g., width) of the fourth via 1316. The fifth interconnect 1328 is coupled to the fifth via 1318. The fifth interconnect 1328 is a pad (e.g., bump pad, via pad). The fifth interconnect 1328 has a first dimension (e.g., width) that is the same or less than a first dimension (e.g., width) of the fifth via 1318. The under fill 1308 is between the substrate 1302 and the die 1304.

The die 1304 includes a first bump 1330, a second bump 1332, a third bump 1334, a fourth bump 1336, and a fifth bump 1338. Each of the bump may include at least an under bump metallization (UBM) layer, an interconnect pillar (e.g., copper pillar), and a solder ball. As shown in FIG. 13, the first bump 1330 is coupled to the first interconnect 1320 such that the first bump 1330 is vertically (e.g., partially, substantially, completely) over the first via 1310. The second bump 1332 is coupled to the second interconnect 1322 such that the second bump 1332 is vertically (e.g., partially, substantially, completely) over the second via 1312. The third bump 1334 is coupled to the third interconnect 1324 such that the third bump 1334 is vertically (e.g., partially, substantially, completely) over the third via 1314. The fourth bump 1336 is coupled to the fourth interconnect 1326 such that the fourth bump 1336 is vertically (e.g., partially, substantially, completely) over the fourth via 1316. The fifth bump 1338 is coupled to the fifth interconnect 1328 such that the fifth bump 1338 is vertically (e.g., partially, substantially, completely) over the fifth via 1318.

In some implementations, the first via 1310 includes a first metal layer 1311 and a second metal layer 1313. In some implementations, the first metal layer 1311 is a seed metal layer. In some implementations, the first metal layer 1311 is an electroless metal layer.

Exemplary Method for Providing a Substrate that Includes a Via in a Bump Area

FIG. 14 illustrates an exemplary method for providing/manufacturing/fabricating a substrate that includes a via under a bump area. It should be noted that for the purpose of clarity and simplification, the processes of FIG. 14 do not necessarily include all the steps and/or stages of manufacturing a substrate. Moreover, in some instances, several steps and/or stages may have been combined into a single step and/or stage in order to simplify the description of the processes. It should also be noted that the shapes of the patterns, pattern features, components (e.g., composite conductive trace, vias) in FIG. 14 are merely conceptual illustrations and are not intended to necessarily represent the actual shape and form of the patterns, pattern features and components.

As shown in FIG. 14, a method provides (at 1405) a substrate. In some implementations, providing (at 1405) a substrate may include fabricating (e.g., forming) a substrate or receiving a substrate from a supplier. Different implementations may use different materials for the substrate. In some implementations, the substrate may include one of at least silicon, glass, ceramic and/or dielectric. In some implementations, the substrate may include several layers (e.g., laminate substrate that includes core layer and several prepreg layers).

Next, the method provides (at 1410) at least one cavity in the substrate. For example, the method may provide a first cavity 1203, a second cavity 1205, and a third cavity 1207 in the substrate 1402, as shown in stage 2 of FIG. 12A. The first cavity 1403, the second cavity 1405, and the third cavity 1407 traverse the substrate 1402. Different implementations may provide different manufacturing processes for providing (e.g., forming, creating) the cavities. In some implementation, the cavities are provided (at stage 1410) using a laser etching process.

The method then provides (at 1415) a first metal layer on the wall of at least one cavity. In some implementations, providing (e.g., forming) the first metal layer includes plating the wall surface of the cavities with a metal layer. In some implementations, the first metal layer is an electroless seed metal layer. Stage 3 of FIG. 12A illustrates an example of providing the first metal layer. As shown in stage 3 of FIG. 12A, a first metal layer 1204 is plated on the wall surface of the first cavity 1203, a second metal layer 1206 is plated on the wall surface of the second cavity 1205, and a third metal layer 1208 is plated on the wall surface of the third cavity 1207. In some implementations, providing (e.g., forming, creating) the metal layers on the walls of the cavities includes using an electroless copper plating process.

The method further provides (at 1420) a resist layer on the substrate. In some implementations, the resist layer is dry film layer. However, different implementations may use different materials for the resist layer. Stage 4 of FIG. 12B, illustrates an example of providing a dry film layer (e.g., dry film 1210) on a first surface of the substrate (e.g., substrate 1202).

The method then provides (at 1425) at least one cavity (e.g., opening) in the resist layer. Stage 5 of FIG. 12B illustrates an example of at least one cavity formed in a resist layer (e.g., dry film layer). As shown in stage 5, a first opening 1213, a second opening 1215, a third opening 1217, a fourth opening 1211, and fifth opening 1219 are provided in the dry film layer 1210. Different implementations may provide (e.g., forming, creating) the openings differently. In some implementations, the openings are provided using exposure and development techniques. In some implementations, the openings have a dimension (e.g., width) that is equal or less then the cavities in substrate.

The method further provides (at 1430) a second metal layer on the substrate. In some implementations, at least some of the second metal layer is provided on the first metal layer. Stage 6 of FIG. 12B illustrates an example of providing a second metal layer. As shown at stage 6, the first cavity 1203 is filled with metal to form the first via 1232, the second cavity 1205 is filled with metal to form the second via 1234, and the third via 1207 is filled with metal to form the third via 1236. In addition, the first opening 1213, the second opening 1215, the third opening 1217, the fourth opening 1211, and the fifth opening 1219 are filled with metal to respectively form, a first interconnect 1222, a second interconnect 1224, a third interconnect 1226, a fourth interconnect 1221, and a fifth interconnect 1229. In some implementations, providing (at stage 6) the metal includes using an electrolytic plating process. In some implementations, the interconnects 1221, 1222, 1224, 1226 and 1229 have a size (e.g., lateral dimension) that is the same or less than the cross-sectional size of a via. For example, in some implementations, the size (e.g., width) of the interconnect 1222 is the same or less than the cross-sectional size (e.g., width) of the via 1232.

The method then removes (at 1435) the resist layer. Stage 7 of FIG. 12C illustrates an example of removing the resist layer. As shown in stage 7 of FIG. 12C, the dry film layer (e.g., dry film 1410) is removed. In some implementations, removing the dry film includes etching away any remaining dry film.

The method further selectively provides (at 1440) a solder resist layer. Stage 8 of FIG. 12C illustrates an example of selectively providing a solder resist layer. As shown in stage 8 of FIG. 12C, a solder resist layer 1240 is selectively provided on the substrate. Different implementations may selectively provide the solder resist layer. In some implementations, selectively providing (e.g., forming, creating) the solder resist layer includes providing the solder resist layer, flash etching, and/or back end processing.

Exemplary Flow Diagram for Plating Process

FIG. 15 illustrates a flow diagram for a modified semi-additive processing (mSAP) patterning process for manufacturing a substrate. FIG. 15 will be described with reference to FIG. 16 which illustrates a sequence of a layer (e.g., core layer, prepreg layer) of a substrate during the mSAP process of some implementations.

As shown in FIG. 15, the process 1500 may start by thinning (at 1505) a metal layer (e.g., copper composite material) on a dielectric layer. The dielectric layer may be a core layer or a prepreg layer of the substrate. In some implementations, the metal layer is thinned to a thickness of about 3-5 microns (μm). The thinning of the metal layer is illustrated in stage 1 of FIG. 16, which illustrates a dielectric layer 1602 that includes a thin copper layer 1604 (which may be a copper composite material). In some implementations, the metal layer may already be thin enough. For example, in some implementations, the core layer or dielectric layer may be provided with a thin copper foil. As such, some implementations may bypass/skip thinning the metal layer of the core layer/dielectric layer. In addition, in some implementations electroless copper seed layer plating may performed to cover the surface of any drilled vias in one or more dielectric layers.

Next, the process applies (at 1510) a dry film resist (DFR) and a pattern is created (at 1515) on the DFR. Stage 2 of FIG. 16 illustrates a DFR 1606 being applied on top of the thinned metal layer 1604, while stage 3 of FIG. 16 illustrates the patterning of the DFR 1606. As shown in stage 3, the patterning creates openings 1608 in the DFR 1606.

After patterning (at 1515) the DFR, the process then electrolytically plates (at 1520) a copper material (e.g., copper composite) through the pattern of the DFR. In some implementations, electrolytically plating comprises dipping the dielectric and the metal layer in a bath solution. Referring to FIG. 16, stage 4 illustrates copper materials (e.g., copper composite) 1610 being plated in the openings 1608 of the DFR 1606.

Referring back to FIG. 15, the process removes (at 1525) the DFR, selectively etches (at 1530) the copper foil material (e.g., copper composite) to isolate the features (e.g., create components such vias, composite conductive traces, and/or pads) and ends. Referring to FIG. 16, stage 15 illustrates the removal of the DFR 1606, while stage 6 illustrates the defined features after the etching process. The above process of FIG. 14 may be repeated for each core layer or prepreg layer (dielectric layer) of the substrate. Having described one plating process, another plating process will now be described.

FIG. 17 illustrates a flow diagram for a semi-additive processing (SAP) patterning process for manufacturing a substrate. FIG. 17 will be described with reference to FIG. 18 which illustrates a sequence of a layer (e.g., core layer, prepreg layer) of a substrate during the SAP process of some implementations.

As shown in FIG. 17, the process 1700 may start by providing (at 1705) a dielectric layer that includes copper layer and a primer layer (e.g., a primer coated copper foil). In some implementations, the copper foil is coated with primer and then pressed on the uncured core to form the structure. The primer coated copper foil may be a copper foil. The dielectric layer may be a core layer or a prepreg layer of a substrate. As shown in stage 1 of FIG. 18, the primer 1804 is located between the copper foil 1806 and the dielectric 1802. The copper foil 1806 may be a copper composite foil in some implementations.

Next, the process drills (at 1710) the dielectric layer (e.g., core layer, prepreg layer) to create one or more openings/pattern features (e.g., via pattern features). This may be done to form one or more vias/via features that connect the front and back side of the dielectric. In some implementations, the drilling may be performed by a laser drilling operation. Moreover, in some implementations, the drilling may traverse one or more the metal layers (e.g., primer coated copper foil). In some implementations, the process may also clean the openings/pattern features (e.g., via patterns) created by the drilling operation, by, for example, de-smearing (at 1712) drilled vias/opening on the layer (e.g., core layer).

The process then etches off (at 1715) the copper foil, leaving the primer on the dielectric layer (which is shown in stage 2 of FIG. 18). Next, the process electroless plates (at 1720) a copper seed layer (e.g., copper material) on the primer in some implementations. The thickness of the copper seed layer in some implementations is about 0.1-1 microns (μm). Stage 3 of FIG. 18 illustrates a copper seed layer 1808 on the primer 1804.

Next, the process applies (at 1725) a dry film resist (DFR) and a pattern is created (at 1730) on the DFR. Stage 4 of FIG. 18 illustrates a DFR 1810 being applied on top of the copper seed layer 1808, while stage 5 of FIG. 18 illustrates the patterning of the DFR 1810. As shown in stage 5, the patterning creates openings 1812 in the DFR 1810.

After patterning (at 1730) the DFR, the process then electrolytically plates (at 1735) a copper material (e.g., copper composite material) through the pattern of the DFR. In some implementations, electrolytically plating comprises dipping the dielectric and the metal layer in a bath solution. Referring to FIG. 18, stage 6 illustrates copper composite materials 1820 being plated in the openings 1812 of the DFR 1810.

Referring back to FIG. 17, the process removes (at 1740) the DFR, selectively etches (at 1745) the copper seed layer to isolate the features (e.g., create vias, traces, pads) and ends. Referring to FIG. 18, Stage 7 illustrates the removal of the DFR 1810, while Stage 8 illustrates the defined features (e.g., composite conductive trace) after the etching process.

The above process of FIG. 17 may be repeated for each core layer or prepreg layer (dielectric layer) of the substrate.

In some implementations, the SAP process may allow for finer/smaller feature (e.g., trace, vias, pads) formation since the SAP process does not require as much etching to isolate features. However, it should be noted that the mSAP process is cheaper than the SAP process in some implementations. In some implementations, the above process may be used for produce Interstitial Via Hole (IVH) in substrates and/or Blind Via Hole (BVH) in substrates.

The plating processes of FIGS. 15 and 17 may be conceptually simplified to the plating process of FIG. 19 in some implementations. FIG. 19 illustrates a flow diagram for a plating method for manufacturing a substrate. As shown in FIG. 19, the method electrolytically plates (at 1905) a copper (e.g., copper composite) through a pattern in a dry film resist (DFR) on a layer of a substrate. The layer may be a dielectric layer. The layer may be a core layer or a prepreg layer of the substrate. In some implementations, the copper (e.g., copper composite) is plated over a copper seed layer, which was previously deposited on the layer (e.g., when using a SAP process). In some implementations, the copper (e.g., copper composite) is plated over a copper foil layer, which was previously on the layer (e.g., when using an mSAP process). The copper foil layer may be a copper composite material in some implementations.

Next, the method removes (at 1910) the DFR from the layer. In some implementations, removing the DFR may include chemically removing the DFR. After removing (at 1910) the DFR, the method selectively etches (at 1915) the foil or seed layer to isolate/define the features of the layer and ends. As described above, the foil may be a copper composite material.

In some implementations, a nickel alloy may be added (e.g., plated) over some or all of a copper layer (e.g., copper foil) during an mSAP process (e.g., methods of FIGS. 15, and 17). Similarly, a nickel alloy may also be added (e.g., plated) over some or all of a copper layer (e.g., copper foil) during a subtractive process.

Exemplary Electronic Devices

FIG. 20 illustrates various electronic devices that may be integrated with any of the aforementioned integrated device (e.g., semiconductor device), integrated circuit, die, interposer and/or package. For example, a mobile telephone 2002, a laptop computer 2004, and a fixed location terminal 2006 may include an integrated device 2000 as described herein. The integrated device 2000 may be, for example, any of the integrated devices, integrated circuits, dice or packages described herein. The devices 2002, 2004, 2006 illustrated in FIG. 20 are merely exemplary. Other electronic devices may also feature the integrated device 2000 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 4, 5, 6, 7, 8, 9, 10, 11, 12A-12C, 13, 14, 15, 16, 17, 18, 19 and/or 20 may be rearranged and/or combined into a single component, step, feature or function or embodied in several components, steps, or functions. Additional elements, components, steps, and/or functions may also be added without departing from the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:

a substrate;

a plurality of vias traversing the substrate, a first via of the plurality of vias having a first via dimension; and a first bump pad coupled to a first end of a first via, wherein the first bump pad has a first pad dimension that is equal to or less than the first via dimension;

a plurality of interconnects on the substrate;

wherein the plurality of vias are co-planar and arranged in rows and columns;

wherein, for at least a row of vias of the plurality of vias, only one respective interconnect of the plurality of interconnects is located between each pair of vias in the row.

2. The integrated device of claim 1, further comprising:

a second via traversing the substrate, wherein the second via has a second via dimension; and a second bump pad coupled to a second end of a second via, wherein the second bump pad has a second pad dimension that is equal to or less than the second via dimension.

3. The integrated device of claim 2, wherein a pitch between the first via and the second via is about 80 microns (μm) or less.

4. The integrated device of claim 2, wherein a pitch between the first via and the second via is about 125 microns (μm) or less.

5. The integrated device of claim 1, wherein the first bump pad is configured to couple to an interconnect of a die.

6. The integrated device of claim 1, wherein the first bump pad is a peripheral bump pad that is located adjacent to an edge of a die area of the substrate.

7. The integrated device of claim 1, wherein the first bump pad is configured to couple to a first bump from a die.

8. The integrated device of claim 7, wherein the first bump includes a first under metallization (UBM) layer, a first interconnect pillar, and a first solder ball.

9. The integrated device of claim 1, wherein the substrate comprises one of at least a dielectric, glass, ceramic, and/or silicon.

10. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. The integrated device of claim 1, wherein the first via is filled with a metal across an entirety of the first via dimension.

12. The integrated device of claim 1, wherein the first pad dimension is a pad width and the first via dimension is a via width and an interface between the first bump pad and the first via is co-planar with a surface of the substrate.

13. The integrated device of claim 1, wherein the plurality of interconnects include additional bump pads coupled to respective traces.

14. The integrated device of claim 1, wherein, for at least a column of vias of the plurality of vias, only one respective interconnect of the plurality of interconnects is located between each pair of vias in the column.

15. A method for fabricating an integrated device, comprising:

forming a substrate;

forming a plurality of vias traversing the substrate, a first via of the plurality of vias having a first via dimension;

forming a first bump pad on a first end of the first via such that the first bump pad is coupled to the first via, wherein the first bump pad has a first pad dimension that is equal to or less than the first via dimension;

forming a plurality of interconnects on the substrate; and arranging the plurality of vias in rows and columns such that for at least a row of vias of the plurality of vias, only one respective interconnect of the plurality of interconnects is located between each pair of vias in the row;

wherein the plurality of vias are co-planar.

16. The method of claim 15, further comprising:

forming a second via traversing the substrate, wherein the second via has a second via dimension; and forming a second bump pad on a second end of the second via such that the second bump pad is coupled to the second via, wherein the second bump pad has a second pad dimension that is equal to or less than the second via dimension.

17. The method of claim 16, wherein a pitch between the first via and the second via is about 80 microns (μm) or less.

18. The method of claim 16, wherein a pitch between the first via and the second via is about 125 microns (μm) or less.

19. The method of claim 15, wherein the first bump pad is configured to couple to an interconnect of a die.

20. The method of claim 15, wherein the first bump pad is a peripheral bump pad that is located adjacent to an edge of a die area of the substrate.

21. The method of claim 15, wherein the first bump pad is configured to couple to a first bump from a die.

22. The method of claim 21, wherein the first bump includes a first under metallization (UBM) layer, a first interconnect pillar, and a first solder ball.

23. The method of claim 15, wherein the substrate comprises one of at least a dielectric, glass, ceramic, and/or silicon.

24. The method of claim 15, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

25. The method of claim 15, further comprising:

filling the first via with a metal across an entirety of the first via dimension.

26. The method of claim 15, wherein the first pad dimension is a pad width and the first via dimension is a via width and an interface between the first bump pad and the first via is co-planar with a surface of the substrate.

27. The method of claim 15, wherein the plurality of interconnects include additional bump pads coupled to respective traces.

28. The method of claim 15, wherein, for at least a column of vias of the plurality of vias, only one respective interconnect of the plurality of interconnects is located between each pair of vias in the column.

* * * * *